US011467229B2

(12) United States Patent
Bramanti et al.

(10) Patent No.: US 11,467,229 B2
(45) Date of Patent: Oct. 11, 2022

(54) TRIAXIAL MAGNETIC SENSOR FOR MEASURING MAGNETIC FIELDS, AND MANUFACTURING PROCESS THEREOF

(71) Applicant: STMICROELECTRONICS S.r.l., Agrate Brianza (IT)

(72) Inventors: Alessandro Paolo Bramanti, Maglie (IT); Alberto Pagani, Nova Milanese (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 154 days.

(21) Appl. No.: 16/880,807

(22) Filed: May 21, 2020

(65) Prior Publication Data

US 2020/0371169 A1    Nov. 26, 2020

(30) Foreign Application Priority Data

May 23, 2019    (IT) .................... 102019000007167

(51) Int. Cl.
*G01R 33/07*      (2006.01)
*G01R 33/00*      (2006.01)
(Continued)

(52) U.S. Cl.
CPC ......... *G01R 33/07* (2013.01); *G01R 33/0052* (2013.01); *G01R 33/0206* (2013.01);
(Continued)

(58) Field of Classification Search
CPC ............... G01R 33/07; G01R 33/0052; G01R 33/0206; H01L 43/065; H01L 43/14; H01L 43/04
See application file for complete search history.

(56) References Cited

U.S. PATENT DOCUMENTS 7,126,330 B2 *  10/2006   Peczalski ............... B82Y 25/00
                                                          324/247
8,289,021 B2    10/2012   Vigna et al.
(Continued)

FOREIGN PATENT DOCUMENTS

JP         2004-6752 A      1/2004

OTHER PUBLICATIONS

Alberts et al., "Nucleation and growth gallium arsenide on silicon", *Journal of Materials Science*, 29, 1994, pp. 2017-2024.
(Continued)

*Primary Examiner* — Dominic E Hawkins
(74) *Attorney, Agent, or Firm* — Seed IP Law Group LLP

(57) ABSTRACT

Various embodiments provide a triaxial magnetic sensor, formed on or in a substrate of semiconductor material having a surface that includes a sensing portion and at least one first and one second sensing wall, which are not coplanar to each other. The sensing portion and the first sensing wall form a first solid angle, the sensing portion and the second sensing wall form a second solid angle, and the first sensing wall and the second sensing wall form a third solid angle. A first Hall-effect magnetic sensor extends at least partially over the sensing portion, a second Hall-effect magnetic sensor extends at least partially over the first sensing wall, and a third Hall-effect magnetic sensor extends at least partially over the second sensing wall.

26 Claims, 16 Drawing Sheets

(51) Int. Cl.
| | |
|---|---|
| *G01R 33/02* | (2006.01) |
| *H01L 43/04* | (2006.01) |
| *H01L 43/06* | (2006.01) |
| *H01L 43/14* | (2006.01) |

(52) U.S. Cl.
CPC ............ *H01L 43/04* (2013.01); *H01L 43/065* (2013.01); *H01L 43/14* (2013.01)

(56) References Cited

U.S. PATENT DOCUMENTS

| | | | |
|---|---|---|---|
| 10,534,045 B2* | 1/2020 | Green | H01L 27/22 |
| 2006/0236923 A1 | 10/2006 | Kouvetakis et al. | |
| 2011/0301897 A1* | 12/2011 | Weiss | G01C 17/38 702/85 |
| 2012/0007597 A1* | 1/2012 | Seeger | G01R 33/07 324/244 |
| 2012/0013332 A1* | 1/2012 | Honkura | G01R 33/0206 324/244 |
| 2014/0266187 A1* | 9/2014 | Mather | G01R 33/096 324/252 |
| 2015/0285873 A1 | 10/2015 | Cai et al. | |
| 2017/0345997 A1 | 11/2017 | Ausserlechner | |
| 2018/0275218 A1* | 9/2018 | Umetsu | G01R 33/0206 |

OTHER PUBLICATIONS

Abderrahmane et al., "Robust Hall Effect Magnetic Field Sensors for Operation at High Temperatures and in Harsh Radiation Environments", *IEEE Transactions on Magnetics*, 42(11), 2012, pp. 4421-4423.

Bailey, "A V-Grooved GaAs Solar Cell", *20th Photovoltaic Specialists Conference*, 1988, 9 pages.

Bailey et al., "Chemical Etching and Organometallic Chemical Vapor Deposition on Varied Geometries of GaAs", *Materials Science*, N89-24728, 1989, pp. 250-263.

Bajwa, "KOH etching of (100) Si wafer, No. 1", University of Pennsylvania Scholarly Commons, Protocols and Reports, Paper 18, 2016, 8 pages.

Chand et al., "GaAs on Silicon Grown by Molecular Beam Epitaxy: Progress and Applications for Selectively Doped Heterostructure Transistors", *Materials Science and Engineering*, B3, 1989, pp. 485-496.

Chu et al., "Nanoscale Growth of GaAs on Patterned Si(111) Substrates by Molecular Beam Epitaxy", *Cryst. Growth Des.*, 14(2), 2014, pp. 593-598.

Erickson, "A Study of Anisotropic Chemical Etching on Crystalline Silicon", Physics Capstone Project, Paper 7, 2014, 5 pages.

"Geomagnetism: Frequently Asked Questions", National Centers for Environmental Information, National Oceanic and Atmospheric Administration, https://www.ngdc.noaa.gov/geomag/faqgeom.shtml#What_is_the_Earths_magnetic_field, 12 pages.

Ghosh et al., "Impact of GaN buffer layer thickness on structural and optical properties of AlGaN/GaN based high electron mobility transistor structure grown on Si(111) substrate by plasma assisted molecular beam epitaxy technique", *Proceedings of the 2015 Third International Conference on Computer, Communication, Control and Information Technology (C3IT)*, 2015, 4 pages.

"Global market size forecast: mobile internet device 2010-2020", Statista Research Department, Dec. 2011, 2 pages.

Haned et al., "Nano-tesla magnetic field magnetometry using an InGaAs—AlGaAs—GaAs 2DEG Hall sensor", *Sensors and Actuators*, A 102, 2003, pp. 216-222.

Kelly et al., "Anisotropy in the wet-etching of semiconductors", *Current Opinion in Solid State and Materials Science*, 9, 2005, pp. 84-90.

Kim et al., "Influence of V-pits on the efficiency droop in InGaN/GaN quantum wells", *Optical Society of America*, 22(S3), 2014, 10 pages.

Kozawa et al., "Dislocation Etch Pits in GaN Epitaxial Layers Grown on Sapphire Substrates", *J. Electrochem. Soc.*, 143(1), 1996, pp. L17-L19.

Long et al., "Growth and fabrication of semi-polar InGaN/GaN multi-quantum well light-emitting diodes on microstructured Si (001) substrates", *Chinese Physics B*, 24(11), 118102, 8 pages.

Mosser et al., "Low-cost 2DEG magnetic sensor with metrological performances for magnetic field and current sensing", *1997 International Conference on solid-State Sensors and Actuators*, 1997, pp. 401-404.

Nguyen van Dau et al., "Magnetic sensors for nanotesla detection using planar Hall effect", *Sensors and Actuators*, A53, 1996, pp. 256-260.

Nifa et al., "Characterization of 2DEG in AlGaN/GaN heterostructure by Hall effect", *Microelectronic Engineering*, 178, 2017, pp. 128-131.

Roumenin, "Handbook of Sensors and Actuators: Solid State Magnetic Sensors", Chapter 4, *Elsevier Science*, vol. 2, 1984.

Schäpers et al., "Reflection and Transmission of Ballistic Electrons at a Potential Barrier", *Superlattices and Microstructures*, 14(1), 1993, pp. 57-63.

Todaro et al., "A fully integrated GaAs-based three-axis Hall magnetic sensor exploiting selfpositioned strain released structures", *Journal of Micromechanics and Microengineering*, vol. 20, 2010, 7 pages.

Tsai et al., "Understanding and Predicting GaN Anisotropic Wet Etch Facet Evolution", Electronic Materials Conference, Jun. 23, 2016, 26 pages.

Tumanski, "Induction coil sensors—A review", Measurement Science and Technology, 18(3), 2007, pp. R31-R46.

Yang et al., "GaN-on-patterned-silicon (GPS) technique for fabrication of GaN-based MEMS", *Sensors and Actuators*, A 130-131, 2006, pp. 371-378.

* cited by examiner

TRIAXIAL MAGNETIC SENSOR FOR MEASURING MAGNETIC FIELDS, AND MANUFACTURING PROCESS THEREOF

BACKGROUND

Technical Field

The present disclosure relates to a triaxial magnetic sensor and to the manufacturing process thereof.

Description of the Related Art

As known, magnetic sensors enable measuring a magnetic field and for this reason are commonly used in applications such as geomagnetic measurements, measurements of environmental disturbance or navigation systems. They also find application in communication systems, in mobile phones, also jointly with global positioning systems (also known as GPS).

In order to provide efficient and practical use thereof, the magnetic sensors have small dimensions (ideally, they can be integrated in a semiconductor material die, for example, for integrated circuits in CMOS—Complementary Metal-Oxide Semiconductor—technology) and, at the same time, provide high sensitivity in the measurement of the magnetic field. In particular, the desired sensitivity depends upon the particular application for which the magnetic sensors are used; generally, magnetic sensors are considered as having high sensitivity when they enable measuring magnetic fields of the same order as the Earth's magnetic field (generally in the range 20-70 µT).

Among known magnetic sensors, magnetic sensors that exploit the Hall effect are widely used, wherein a difference of potential, referred to as Hall potential, is set up between two different points of a conductive material passed by a current (orthogonal to the Hall potential), in presence of a magnetic field orthogonal to the electric current and to the Hall potential.

FIG. 1 shows a Hall-effect magnetic sensor, based upon a Greek cross-shaped (more simply, a cross) conductive structure and thus referred to hereinafter as Hall cross 1, integrated in a die 2 of semiconductor material.

In FIG. 1, a Cartesian reference system of mutually orthogonal axes X, Y, Z is used.

The Hall cross 1 comprises a conductive region 3 formed on or in a substrate 5. The conductive region 3, of semiconductor material (for example, silicon), extends in a plane XY defined by axes X and Y, and has four arms 7, 8, 9, 10.

A first arm 7 of the conductive region 3 is electrically connected to a supply source $V_a$, whereas a second arm 8, which is an extension of the first arm 7, is electrically connected to a reference potential (for example, 0 V). A third arm 9 and a fourth arm 10, in prosecution of each other, are orthogonal to the first arm 7 and to the second arm 8. In FIG. 1, the first and second arms 7, 8 are parallel to axis X, and the third and fourth arms 9, 10 are parallel to axis Y. Furthermore, arms 7-10 meet in a central area 12. The Hall potential $V_H$ is measured electrically between mutually opposite ends of the third and fourth arms 9, 10 by a per se known high-impedance measure (for example, via an electronic system integrated in the die 2, to carry out a four-point measure).

A supply current $I_a$ flows from the first arm 7 to the second arm 8 along axis X and, in presence of an external magnetic field B along axis Z, the Hall potential $V_H$ is generated along axis Y, as a consequence of the Lorentz force.

In fact, charge carriers (for example, electrons) present in the conductive region 3 undergo the Lorentz force $\overline{F}$, which in vector form is expressed as follows:

$$\overline{F} = q\overline{v} \times \overline{B}$$

where q is the charge of an electron, $\overline{v}$ is a vector of the drift velocity of the electron (i.e., the velocity of the electron imposed by the supply current $I_a$), and $\overline{B}$ is a vector indicating the external magnetic field B. Due to the Lorentz force, the simultaneous presence in the Hall cross 1 of the supply current $I_a$ and of the external magnetic field B generates a non-zero component along direction Y in the electron trajectory, and therefore a difference of potential between the third and the fourth arms 9, 10 (i.e., the Hall potential $V_H$).

The Hall cross 1 described above and other similar integrated magnetic sensors, have a planar structure and thus enable measuring the spatial component of the magnetic field perpendicular to the laying plane; consequently, they do not allow simultaneous measurement of all the spatial components.

There are various solutions to the above problem.

One possibility regards integration of three magnetic sensors on three different dice, and joining these three dice (for example, by gluing) in just one structure, to form a first sensor system in which each die (and therefore the respective plane on which each respective magnetic sensor lies) is orthogonal to the other two dice (respectively, to the planes of the other two magnetic sensors). The above structure therefore enables measuring all the spatial components of the magnetic field, but proves bulky, difficult to integrate in devices of small dimensions such as mobile phones, and has low reproducibility and a low measuring reliability (possible factors that affect measure are dice alignment error, wear over time of the glue, and external mechanical vibrations that can jeopardize functionality of electrical interconnections).

Another possibility regards creation of a second sensor system that exploits sacrificial layers to create vertical structures carrying the magnetic sensors. These vertical structures have an inclination with respect to the substrate to which they are physically coupled, thus allowing a number of components of the magnetic field to be measured through a respective number of magnetic sensors (see, for example, the paper "A fully integrated GaAs-based three-axis Hall magnetic sensor exploiting self-positioned strain released structures", Todaro et al., J. Micromech. Microeng., 2010). However, also this sensor system is fragile, has low reproducibility, and is extremely sensitive to vibrations coming from outside, and thus finds limited applications in common use.

BRIEF SUMMARY

Various embodiments of the present disclosure provide a triaxial magnetic sensor and the manufacturing process thereof, which solve the problems of the prior art.

According to one embodiment, a triaxial magnetic sensor is formed on or in a substrate of semiconductor material having a surface that includes a sensing portion and at least one first and one second sensing wall, which are not coplanar to each other. The sensing portion and the first sensing wall form a first solid angle, the sensing portion and the second sensing wall form a second solid angle, and the first sensing wall and the second sensing wall form a third solid angle. A first Hall-effect magnetic sensor extends at least partially over the sensing portion, a second Hall-effect magnetic sensor extends at least partially over the first sensing wall, and a third Hall-effect magnetic sensor extends at least partially over the second sensing wall.

BRIEF DESCRIPTION OF THE SEVERAL VIEWS OF THE DRAWINGS

For a better understanding of the present disclosure a various embodiments are now described, purely by way of non-limiting example, with reference to the attached drawings, wherein.

DETAILED DESCRIPTION

In the ensuing description, same elements in the various embodiments are designated by the same reference numbers, whereas the elements that differ are designated by different reference numbers.

Figure 1:
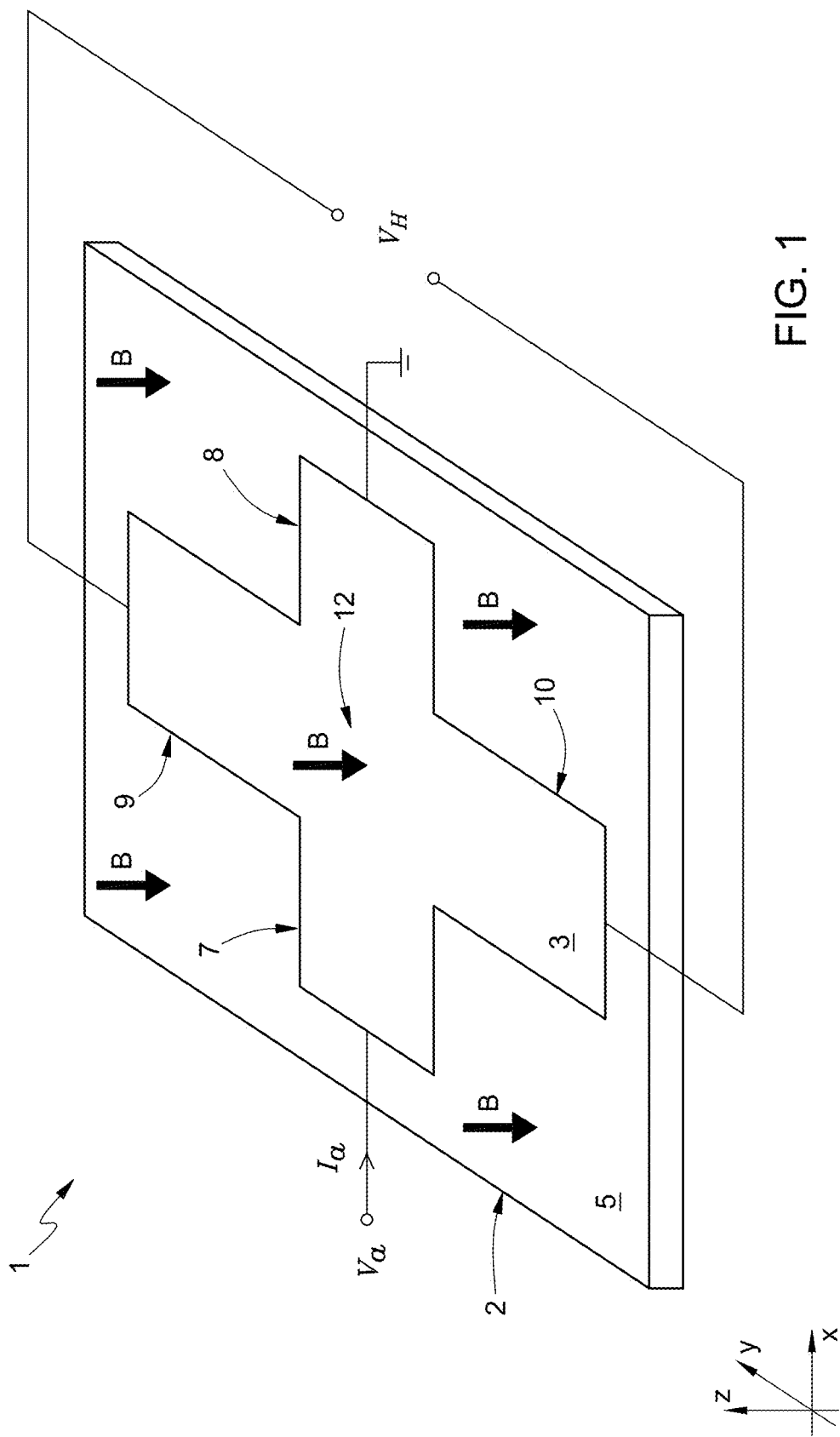
FIG. 1 shows schematically a Hall-effect triaxial magnetic Greek-cross shaped sensor.
Figure 2:
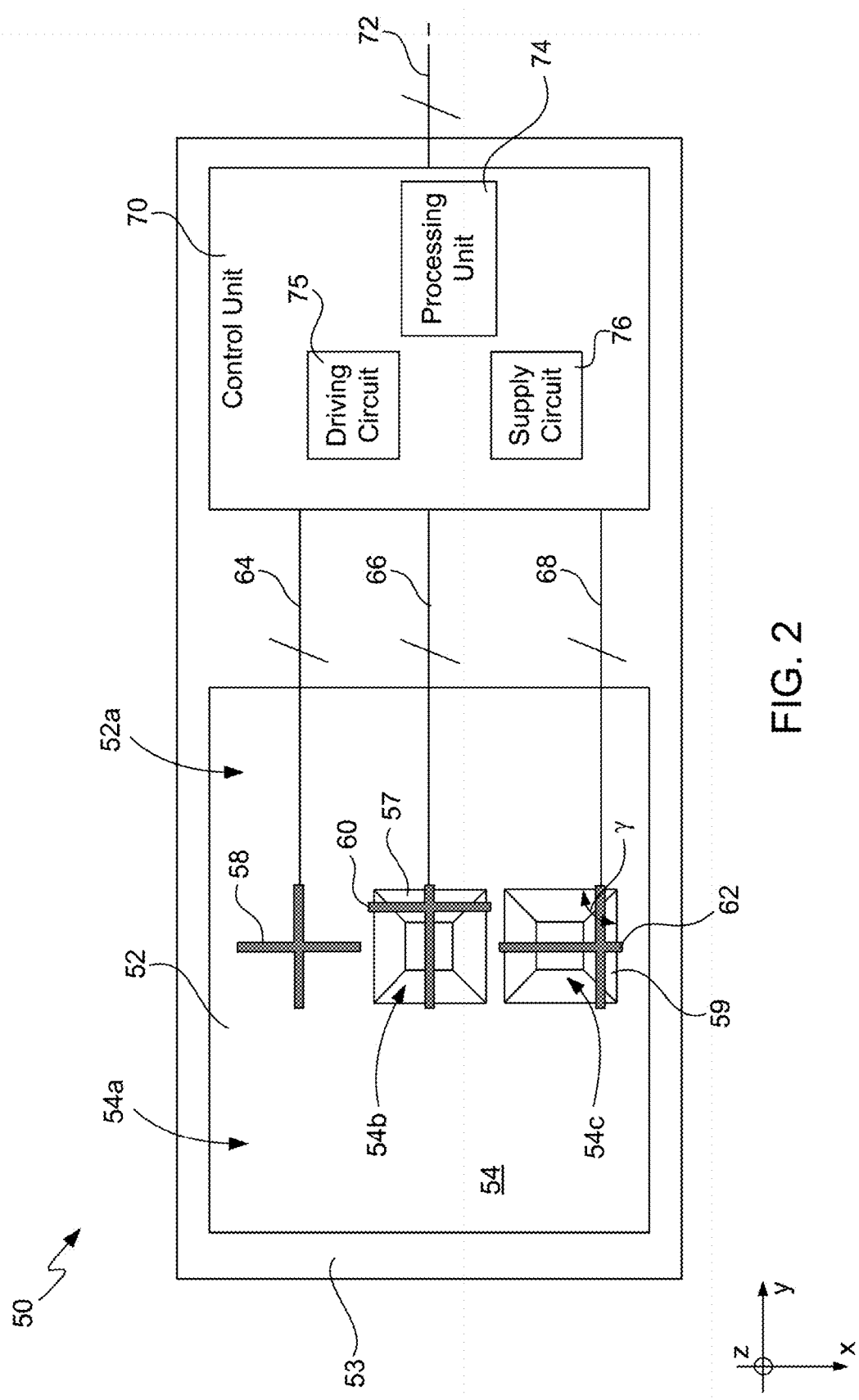
FIG. 2 is a schematic top view of the general structure of the present triaxial magnetic sensor.

With reference to FIG. 2, a triaxial sensor 50 comprises a die 53 integrating a plurality of sensor elements. The die 53 includes a substrate 52, of semiconductor material such as silicon, for example, with a P-type doping and crystallographic orientation (100) so that a control electronics can be easily integrated in the die 53. The substrate 52 has a surface 54 having a planar portion 54a, a first non-planar portion 54b, and a second non-planar portion 54c. The non-planar portions 54b, 54c are formed by recesses (for example, obtained by anisotropic etching of the substrate 52 at the non-planar portions 54b, 54c, as described in detail hereinafter) or by protrusions or reliefs (for example, obtained by anisotropic etching the substrate 52 at the planar portion 54a of the surface 54).

In FIG. 2, the first and second non-planar portions 54b, 54c of the surface 54 are pyramidal- or frustopyramidal-shaped (here with a square base, for example, as a result of an anisotropic etching with potassium hydroxide—KOH—on silicon). In addition, in FIG. 2, the first and second non-planar portions 54b, 54c have sides of the respective bases parallel to each other and to Cartesian axes X, Y of a Cartesian coordinate system XYZ. Other configurations are, however, possible, as discussed below.

In FIG. 2, the planar portion 54a extends in a plane parallel to the plane XY of the Cartesian coordinate system (hereinafter also referred to as plane XY) and the non-planar portions 54b, 54c comprise a first sensing wall 57 and, respectively, a second sensing wall 59. The sensing walls 57, 59 are inclined and form a first inclination angle α (FIG. 9) and a second inclination angle β (FIG. 3A), respectively, with respect to the plane XY (and therefore with respect to the planar portion 54a of the surface 54), are not coplanar and form an angle of mutual inclination γ (shown in FIG. 2 on the second non-planar portion 54c, due to the parallelism of the sides of the base of the sensing walls 57, 59) in a projection of the sensing walls 57, 59 in the plane XY. The first inclination angle α, the second inclination angle β, and the mutual inclination angle γ have an amplitude linked to the manufacturing process and to the particular semiconductor material used, as described below. Here, for example, the mutual inclination angle γ is 90°, due to the frustoconical, square-base shaped of the non-planar portions 54b, 54c and considering a crystallographic orientation (100) of the silicon substrate 52.

In FIG. 2, the triaxial sensor 50 comprises three Hall-effect magnetic sensors, distinct from each other, and including a first sensor element 58, a second sensor element 60, and a third sensor element 62. The first sensor element 58 (of a planar type) extends, at least partially, parallel to and above the planar portion 54a of the surface 54. The second sensor element 60 (of a non-planar type) lies, at least partially, on the first non-planar region 54b and therefore on the first sensing wall 57, and the third sensor element 62 (of a non-planar type) lies, at least partially, on the second non-planar region 54c and therefore on the second sensing wall 59.

The triaxial sensor 50 further includes a control unit 70, configured to enable a plurality of operating functions, amongst which setting biasing of the first, second, and third sensor elements 58, 60, 62 (i.e., imposing the supply current $I_a$ of the sensor elements 58, 60, 62), acquiring the respective Hall potentials $V_H$, and processing data (post-processing) in order to obtain respective components of the magnetic field. To this end, the control unit 70, integrated in a different portion of the die 53, comprises a processing unit 74, for example, a microcontroller or a microprocessor, for data processing, a driving circuit 75, for driving the sensor elements 58-62, and possibly a supply circuit 76. The first, second, and third sensor elements 58, 60, 62 are electrically connected to the control unit 70 through a first connection 64, a second connection 66, and a third connection 68, respectively, for setting the biasing and acquiring the Hall potentials $V_H$. Each of the first, second, and third connections 64, 66, and 68 may possibly be formed by a plurality of further connections.

The triaxial sensor 50 further comprises an output connection 72, configured to connect the control unit 70 to an external apparatus (not illustrated), suitable, for example, for reading and displaying on a screen the measures made by the triaxial sensor 50.

Moreover, in the triaxial sensor 50, the sensor elements 58-62, that are cross-shaped, comprise a conductive region formed by a stack of semiconductor materials suitable to form a 2DEG (Two-Dimensional Electron Gas) region configured to generate a 2DEG. In particular, as described hereinafter, the stack of semiconductor materials includes one or more heterostructures. Materials commonly used to form the heterostructures are gallium and aluminium arsenide (AlGaAs) and gallium arsenide (GaAs), or gallium and aluminium nitride (AlGaN) and gallium nitride (GaN).

In a further embodiment (not illustrated), the control unit 70 may be formed on a further die.

Figures 3, 3A:
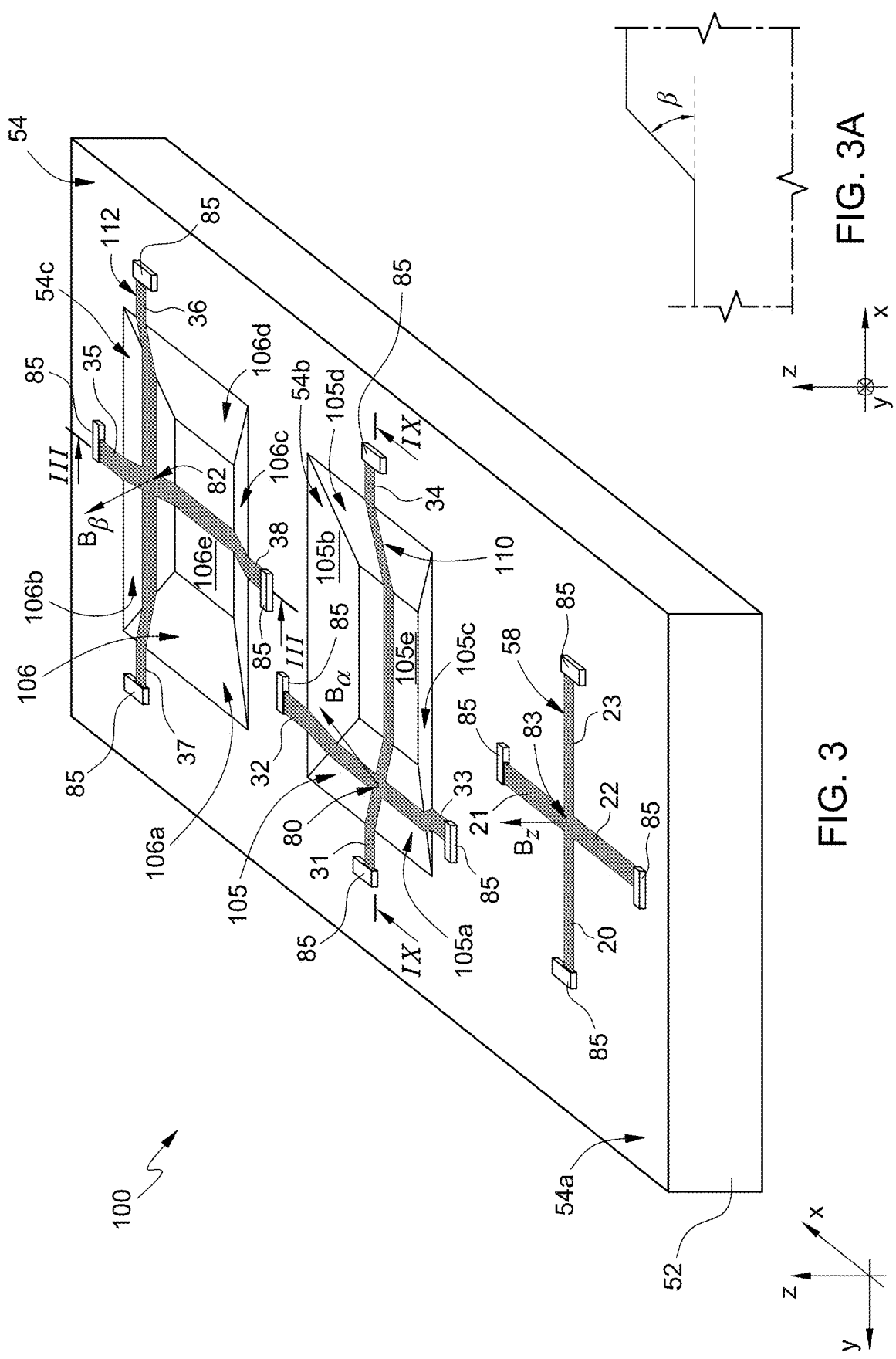
FIG. 3 is a perspective view of an embodiment of the triaxial magnetic sensor of FIG. 2.
FIG. 3A is a sectional view of a detail of the triaxial magnetic sensor of FIG. 3, taken along section line III-III.

FIG. 3 shows an embodiment of the triaxial sensor (here designated by 100) where the non-planar regions 54b, 54c are formed by a first and a second recess (here designated by 105, 106) having a frustoconical shape. In particular, FIG. 3 shows the portion integrating the sensor elements, here referred to as first sensor element 58, second sensor element 110, and third sensor element 112.

As for the triaxial sensor of FIG. 2, each sensor element 58, 110, 112 comprises four arms; namely, the first sensor element 58 has arms 20-23, physically connected together in a first central area 83, the second sensor element 110 has arms 31-34, physically connected together in a second central area 80, and the third sensor element 112 has arms 35-38, physically connected together in a third central area 82. The arms 20-23 of the first sensor element 58, the arms 31-34 of the second sensor element 110, and the arms 35-38 of the third sensor element 112 are arranged to form a cross, in continuation of each other in pairs, orthogonal to each other and parallel to the Cartesian axes X and Y.

In detail, the first sensor element 58 (corresponding to, and having the same designation as, the first sensor element 58 of the embodiment of FIG. 2) is planar and has its arms 20-23 extending on the planar region 54a.

The second sensor element 110 (corresponding to the second sensor element 60 of FIG. 2) is non-planar and extends partially in the first recess 105, which has a frusto-pyramidal shape. In detail, the first recess 105 has a first inclined wall 105a, a second inclined wall 105b, a third inclined wall 105c, and a fourth inclined wall 105d, which here have a trapezial shape and extend transversely to axes X and Y, so that the first and fourth inclined walls 105a and 105d are opposite to each other, and the second and third inclined walls 105b, 105c are opposite to each other and are arranged between the first and fourth inclined walls 105a and 105d. The first recess 105 moreover has a base wall 105e. The inclined walls 105a-105d of the first recess 105 are planar walls. Here, the central area 80 of the second sensor element 110 lies on one of the inclined walls 105a-105d, also referred to hereinafter as first sensing wall 105a, corresponding to the first sensing wall 57 of FIG. 2. For instance, the first sensing wall 105a may have a maximum width along to axis X of approximately 150-300 μm.

Consequently, of the arms 31-34 of the second sensor element 110, a first arm 31 lies in part on the first sensing wall 105a and in part on the planar portion 54a of the surface 54; a second arm 32 lies in part on the first sensing wall 105a, in part on the second inclined wall 105b of the first recess 105, and in part on the planar portion 54a of the surface 54; a third arm 33 lies in part on the first sensing wall 105a, in part on the third inclined wall 105c of the first recess 105, and in part on the planar portion 54a of the surface 54; and a fourth arm 34 lies in part on the first sensing wall 105a, in part on the base wall 105e of the first recess 105, in part on the fourth inclined wall 105d of the first recess 105, and in part on the planar portion 54a of the surface 54.

The third sensor element 112 (corresponding to the third sensor element 62 of FIG. 2) is also non-planar and extends partially in the second recess 106. The second recess 106 here has the same shape and the same spatial orientation as the first recess 105 and has four inclined walls 106a-106d, opposite to each other in pairs, which extend transversely to axes X and Y and here parallel to the homologous inclined walls 105a-105d of the first recess 105. Furthermore, a first inclined wall 106a, a second inclined wall 106b, a third inclined wall 106c, and a fourth inclined wall 106d of the second recess 106 are parallel respectively to the first, the second, the third, and the fourth inclined walls 105a-105d of the first recess 105. The second recess 106 moreover has a base wall 106e.

Here, the central area 82 of the third sensor element 112 lies on the second inclined wall 106b of the second recess 106, also referred to hereinafter as second sensing wall 106b and corresponding to the second sensing wall 59 of FIG. 2.

In FIG. 3, the substrate 52 is of silicon with crystallographic orientation (100), and the first anisotropic etching is carried out via KOH so that the first inclination angle α (FIG. 9) is between 50 and 60°. In one embodiment, the first inclination angle α (FIG. 9) is equal to 54.7°. In one embodiment, the second inclination angle β (see FIG. 3A) is equal to the first inclination angle α. In one embodiment, the first inclination angle α is between 50 and 60°, and the second inclination angle β is between 50 and 60°.

Consequently, of the arms 35-38 of the third sensor element 112, a first arm 35 lies in part on the second sensing wall 106b and in part on the planar portion 54a of the surface 54; a second arm 36 lies in part on the second sensing wall 106b, in part on the fourth inclined wall 106d of the second recess 106, and in part on the planar portion 54a of the surface 54; a third arm 37 lies in part on the second sensing wall 106b, in part on the first inclined wall 106a of the second recess 106, and in part on the planar portion 54a of the surface 54; and a fourth arm 38 lies in part on the second sensing wall 106b, in part on the base wall 106e of the second recess 106, in part on the third inclined wall 106c of the second recess 106 and in part on the planar portion 54a of the surface 54.

In addition, FIG. 3 shows contacts 85, for example, of metal, coupled to the end of each arm 20-23, 31-34, 35-38 opposite to the central area 83, 80, 82 of each sensor element 58, 110, 112. The contacts 85 are configured to electrically connect the respective arms 20-23, 31-34, 35-38 to the control unit 70 (FIG. 2) and lie on the planar portion 54a of the surface 54. Alternatively, the contacts 85 of each arm 31-34, 35-38, or at least one of them, may lie inside the cavity 105, 106.

In use, the first, second, and third sensor elements 58, 110, 112 are biased so as to cause supply currents $I_a$ (for example, of equal values) to flow along two aligned arms (for example, along the first arm 20, 31, 35 and the fourth arm 23, 34, 38) and the Hall potential $V_H$ is measured on the other two arms (for example, between the contacts 85 of the second arm 21, 32, 36 and the third arm 22, 33, 37). Obviously, the arms to which the supply currents $I_a$ are applied and the arms on which the Hall potential $V_H$ is measured may be exchanged.

Since a magnetic sensor such as the Hall cross is configured to measure a magnetic field perpendicular to the laying plane of its central area, as a result of the spatial arrangement of the sensor elements 58, 110, 112, here the first sensor element 58 measures a first magnetic field $B_z$ along axis Z (this magnetic field therefore also being referred to hereinafter as third projection $B_z$); the second sensor element 110 measures a second magnetic field $B_\alpha$, having a first component $B_{\alpha,y}$ along the axis Y and a second component $B_{\alpha,z}$ along the axis Z; and the third sensor element 112 measures a third magnetic field $B_\beta$ having a first component $B_{\beta,x}$ along the axis X and a second component $B_{\beta,z}$ along the axis Z.

Through appropriate data-processing operations it is possible to determine the external magnetic field B (i.e., a first projection $B_x$ of the external magnetic field B along axis X, a second projection $B_y$ of the external magnetic field B along axis Y, and the third projection $B_z$), starting from the measured values of the first magnetic field $B_z$, second magnetic field $B_\alpha$, and third magnetic field $B_\beta$.

In particular, the control unit 70 is configured to calculate, starting from the Hall potentials $V_H$ measured by the first, second, and third sensor elements 58, 110, 112, the values of the first magnetic field $B_z$, second magnetic field $B_\alpha$, and third magnetic field $B_\beta$, respectively, according to per se known techniques (for example, by a linear relation between a Hall potential and a respective component of the magnetic field), and is moreover configured to calculate the first projection $B_x$ and the second projection $B_y$ of the external magnetic field B.

In particular, the first projection $B_x$, the second projection $B_y$, and the third projection $B_z$ are obtained, for example, using a system of three equations in three unknowns, as appears below:

$$B_x = B_z \cdot \tan(\alpha) - B_\beta \cdot \sin(\alpha)$$

$$B_y = B_z \cdot \tan(\alpha) - B_\alpha \cdot \sin(\alpha)$$

$$B_z = B_z$$

The above three projections in the Cartesian system thus define uniquely the external magnetic field B.

Obviously, if the first and second recesses 105, 106 have walls perpendicular to the planar portion 54a of the surface 54 (i.e., when the first and second inclination angles $\alpha$, $\beta$ are equal to 90°), the control unit 70 directly calculates the projections $B_x$, $B_y$, and $B_z$ from the measured Hall potentials $V_H$.

Figure 4:
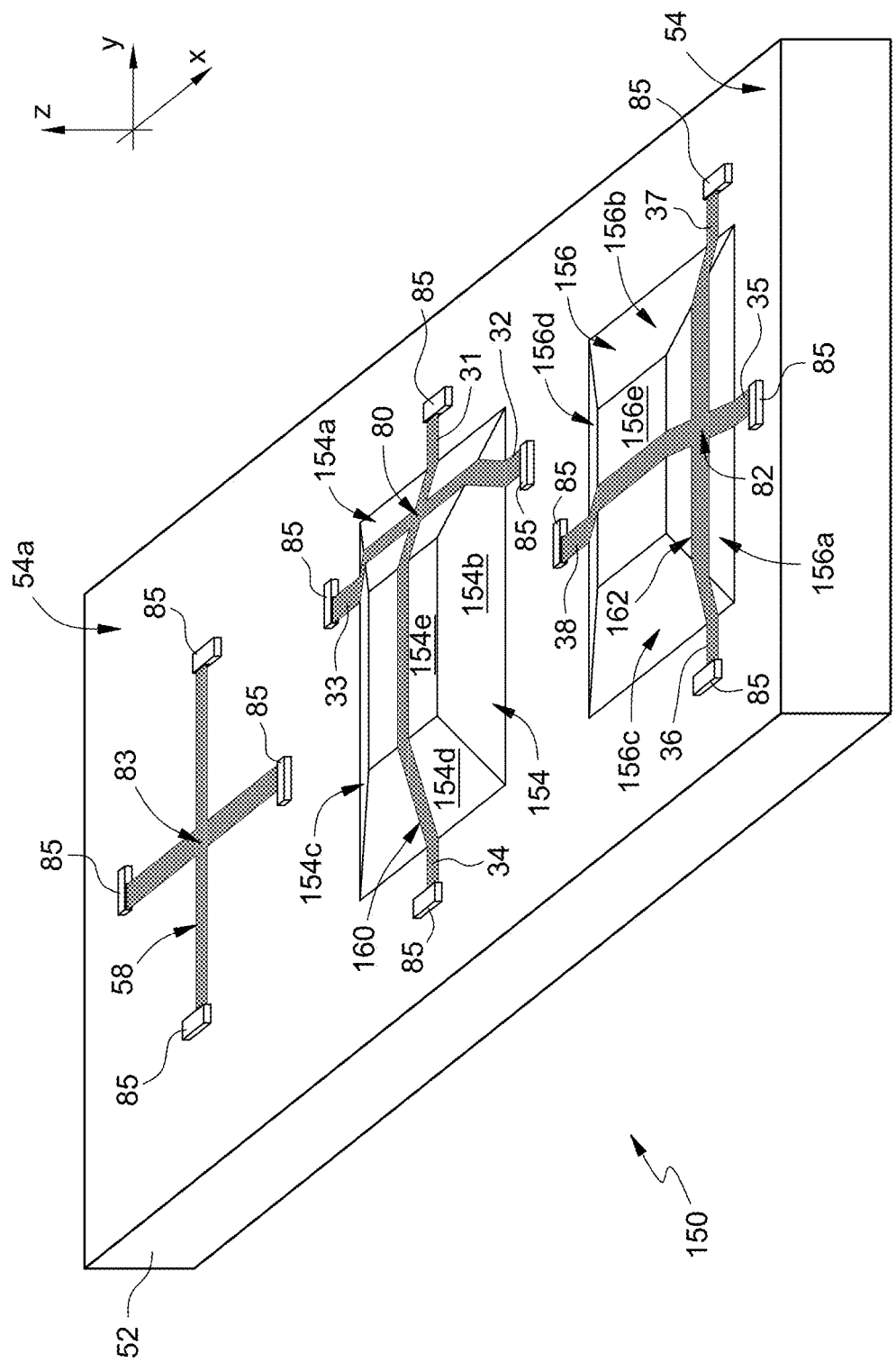
FIG. 4 is a perspective view of a different embodiment of the present triaxial magnetic sensor.

FIG. 4 shows a different embodiment of the present triaxial sensor, here designated by 150. In particular, here, the non-planar regions 54b, 54c of FIG. 2 are formed by protrusions 154, 156, and a second sensor element 160 and a third sensor element 162 lie on the first protrusion 154 and on the second protrusion 156, respectively. Also the protrusions 154, 156 have a frustopyramidal shape and can be formed by anisotropic etching (for example, with KOH on the silicon substrate 52). In this case, the protrusions 154, 156 have inclined walls 154a-154d and, respectively, 156a-156d, as well as respective base walls 154e, 156e, corresponding to the inclined walls 105a-105d, 106a-106d and to the base walls 105e, 106e, even though they have an opposite inclination (inclination angle $-\alpha$). In this case, operation of the triaxial sensor 150 is similar to what has been described above with reference to the triaxial sensor 100 of FIG. 3, except that the first components $B_{\alpha,y}$ and $B_{\beta,x}$ may have opposite sign, according to the inclined wall on which the central areas 80, 82 lie. Also here at least one of the contacts 85 may lie on the first protrusion 154 or on the second protrusion 156.

Figure 5:
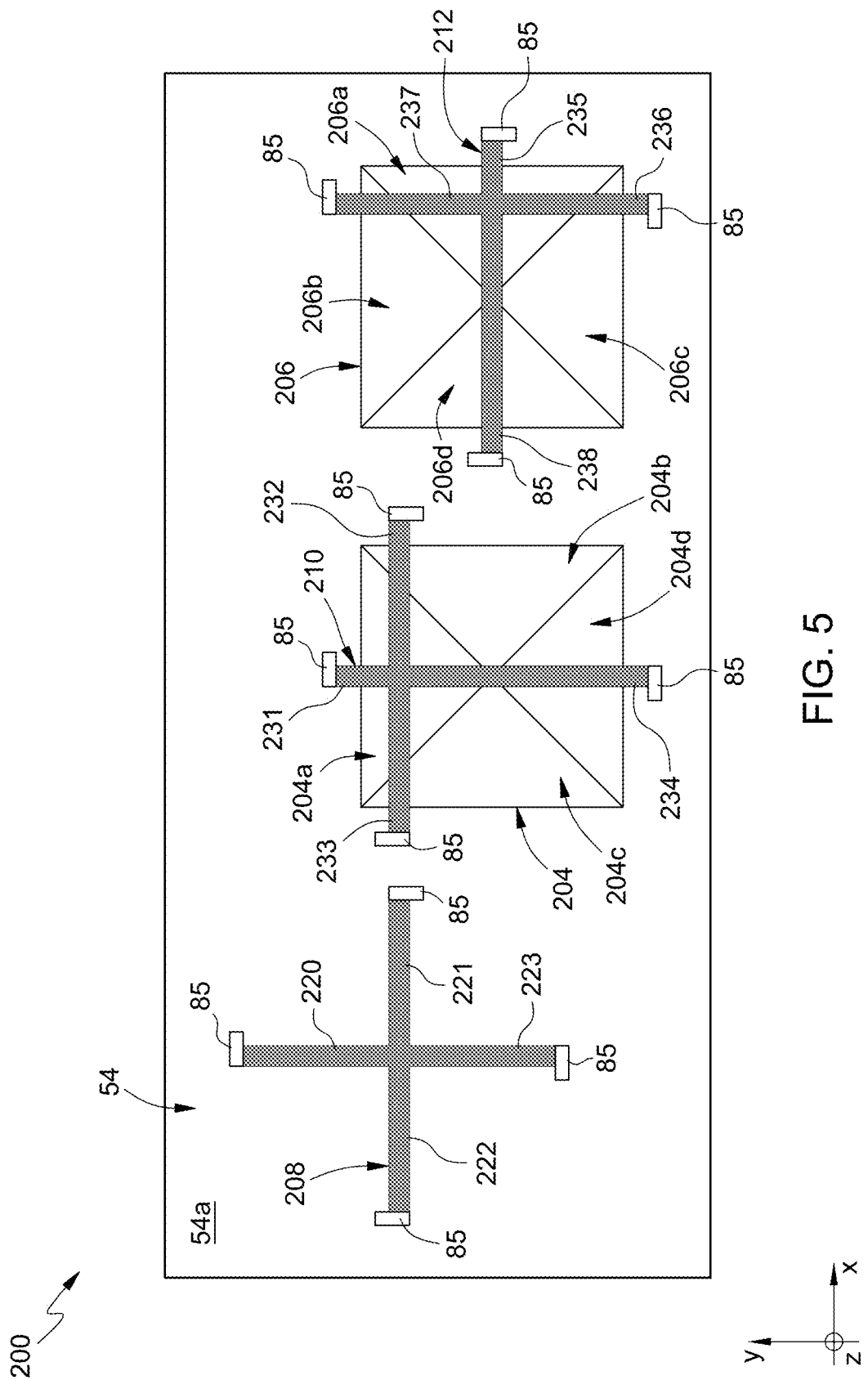
FIGS. 5-8 are top views of further embodiments of the present triaxial magnetic sensor.

FIG. 5 shows a further embodiment of a triaxial sensor (here designated by 200) where the non-planar regions 54b, 54c of FIG. 2 have a pyramidal shape. In particular, FIG. 5 represents both when the non-planar regions (here designated by 204, 206) form recesses and when they form protrusions. The non-planar regions 204, 206 are obtained by an anisotropic etching similar to the one described above, of appropriate duration, which determines formation of inclined walls 204a-204d and 206a-206d. In this case, no bottom walls are present or, if they are present, they have a negligible area and are therefore not illustrated. Here, the first sensor element is designated once again by 58, and the second and third sensor elements are designated by 210 and 212, respectively, and are formed by first arms 231, 235, second arms 232, 236, third arms 233 and 237, and fourth arms 234, 238, respectively.

Figure 6:
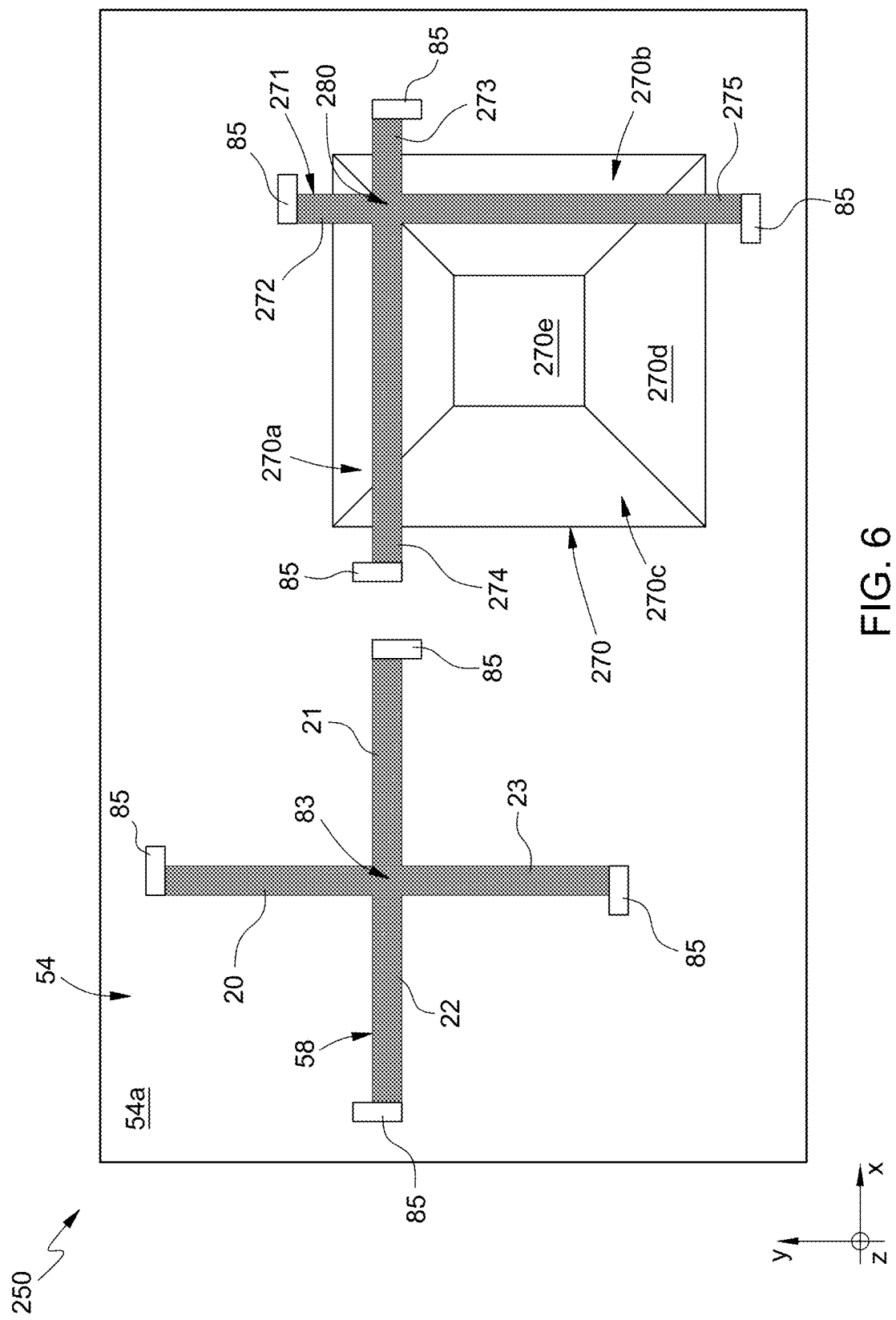

FIG. 6 shows a triaxial sensor 250, which includes, in addition to the planar sensor, here referred to once again as first sensor element 58, a non-planar sensor, referred to hereinafter as combined sensor element 271. The first sensor element 58 is similar to the sensor element 58 of the embodiment of FIG. 3. The combined sensor element 271 is configured, in use, to measure both the second magnetic field $B_\alpha$ and the third magnetic field $B_\beta$, and lies in a recess or in a protrusion 270 having a frustopyramidal shape with a first inclined wall 270a, a second inclined wall 270b, a third inclined wall 270c, and a fourth inclined wall 270a-270d, and a base wall 270e, which are similar to the inclined walls 105a-105d and to the bottom wall 105e of FIG. 3 (or to the inclined walls 154a-154d and to the bottom wall 154e of FIG. 4).

As for the foregoing embodiments, the combined sensor element 271 includes four arms 272-275, each coupled to a respective contact 85 and connected together in a central area 280 arranged along the joining line between the mutually adjacent inclined walls 270a, 270b. In detail, a first arm 272 lies in part on the first inclined wall 270a and in part on the planar portion 54a of the surface 54; a second arm 273 lies in part on the second inclined wall 270b and in part on the planar portion 54a of the surface 54; a third arm 274 lies in part on the first inclined wall 270a, in part on the third inclined wall 270c (adjacent to the first inclined wall 270a and to the fourth inclined wall 270d), and in part on the planar portion 54a of the surface 54; and a fourth arm 275 lies in part on the second inclined wall 270b, in part on the fourth inclined wall 270d (adjacent to the second inclined wall 270b, and opposite, in the recess or protrusion 270, to the first inclined wall 270a), and in part on the planar portion 54a of the surface 54. The arms 274, 273 lie parallel to each other and in continuation of each other in the direction of axis X, whereas the arms 272, 275 lie parallel to each other and in continuation of each other in the direction of axis Y.

In use, the first sensor element 58 of the triaxial sensor 250 is configured to measure the first magnetic field $B_z$, whereas the combined sensor element 271 is configured to measure the second magnetic field $B_\alpha$ and, alternatively, the third magnetic field $B_\beta$.

In detail, the combined sensor element 271 is biased to operate in two steps, which may be periodically alternated with each other during use of the triaxial sensor 250. In a first step, the combined sensor element 271 is biased to cause a supply current $I_a$ to flow along the second and third arms 273, 274, and the Hall potential $V_H$ is measured between the contacts 85 electrically coupled to the first and fourth arms 272, 275. In a second step, the combined sensor element 271 is biased to cause a supply current $I_a$ to flow along the first and fourth arms 272, 275, and the Hall potential $V_H$ is measured between the contacts 85 electrically coupled to the second and third arms 273, 274. In the first step, the combined sensor element 271 measures the second magnetic field $B_\alpha$, whereas, in the second step, it measures the third magnetic field $B_\beta$. In both steps, the first sensor element 58 measures the first magnetic field $B_z$, as described above. The control unit 70, carrying out the same data-processing operations previously described, can thus calculate the external magnetic field B starting from the measurements made by the first sensor element 58 and the combined sensor element 271.

Figure 7:
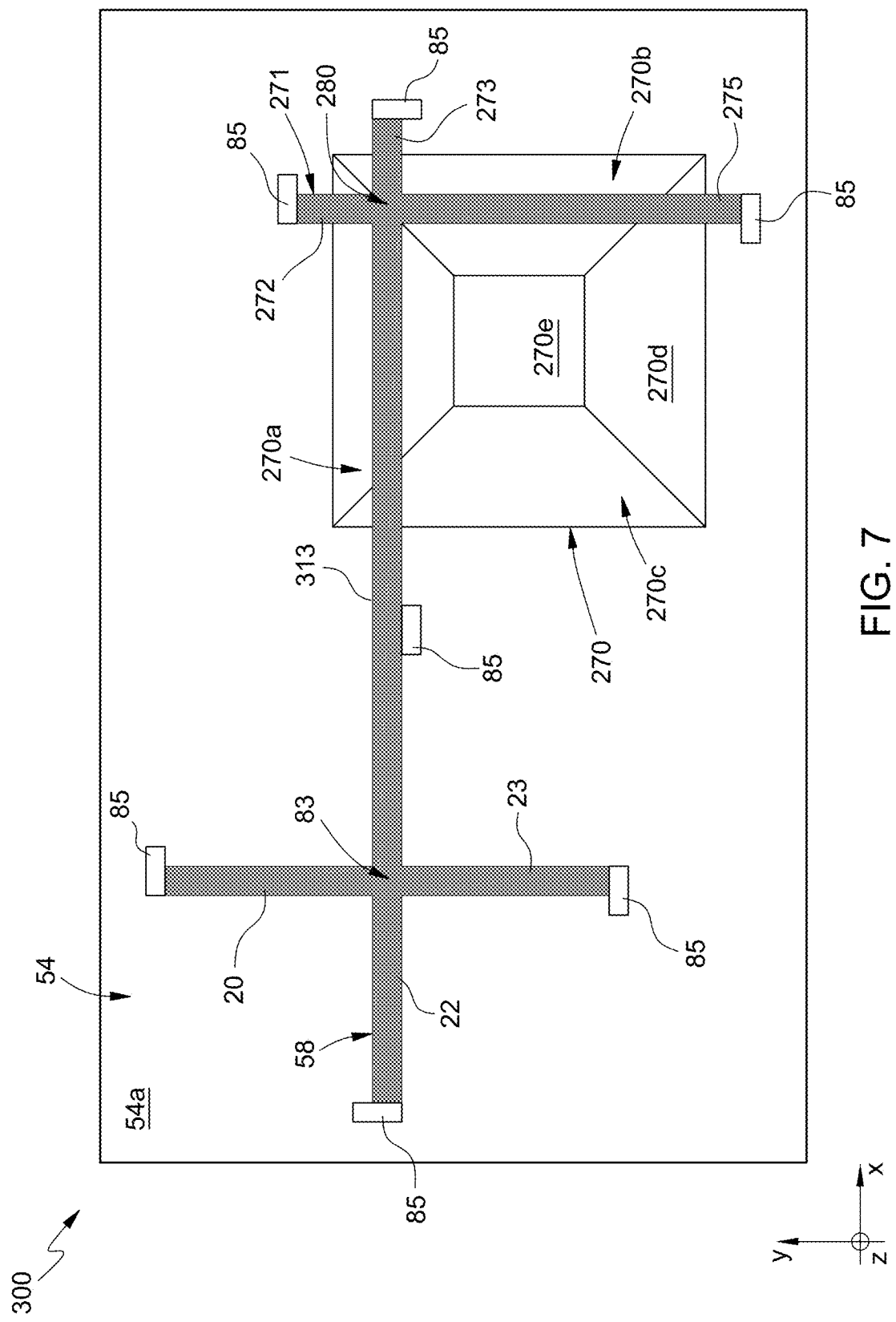

FIG. 7 shows a triaxial sensor 300 similar to the triaxial sensor 250 of FIG. 6, except that the second arm 21 of the first sensor element 58 is prolonged and is connected seamlessly to the third arm 274 of the combined sensor element 271 (FIG. 6) to form a common arm 313 that electrically connects the central area 83 of the first sensor element 58 to the central area 280 of the combined sensor element 271. The common arm 313 is here arranged along axis X and is electrically connected to a contact 85 in an intermediate position.

The triaxial sensor 300 is biased by the control unit 70 to operate in two steps, which can be periodically alternated with each other during use of the triaxial sensor 300. In detail, in a first step, the triaxial sensor 300 of FIG. 7 is biased to cause the supply current $I_a$ to flow in the first sensor element 58 along the first and fourth arms 20, 23 of the first sensor element 58, and the Hall potential $V_H$ is measured between the contact 85 of the third arm 22 of the first sensor element 58 and the contact 85 of the common arm 313. Moreover, in the first step, the triaxial sensor 300 of FIG. 7 is biased to cause the supply current $I_a$ to flow along the first arm 272 and the fourth arm 275 of the combined sensor element 271, and the Hall potential $V_H$ is measured between the contact 85 of the common arm 313 and the contact 85 of the second arm 273 of the combined sensor element 271. In a second step, the triaxial sensor 300 of FIG. 7 is biased to cause the supply current $I_a$ to flow through the third arm 22 of the first sensor element 58, the common arm 313, and the second arm 273 of the combined sensor element 271, and the Hall potential $V_H$ is measured both between the contact 85 of the first arm 20 and the contact 85 of the fourth arm 23 of the first sensor element 58 and between the contacts 85 of the first arm 272 and fourth arm 275 of the combined sensor element 271. In practice, the first step enables measuring the first magnetic field $B_z$ and the third magnetic field $B_\beta$, whereas the second step enables measuring the first magnetic field $B_z$ and the second magnetic field $B_\alpha$. The same data-processing operation previously described thus enables calculation of the external magnetic field B starting from the measures made by the first sensor element 58 and the combined sensor element 271.

Figure 8:
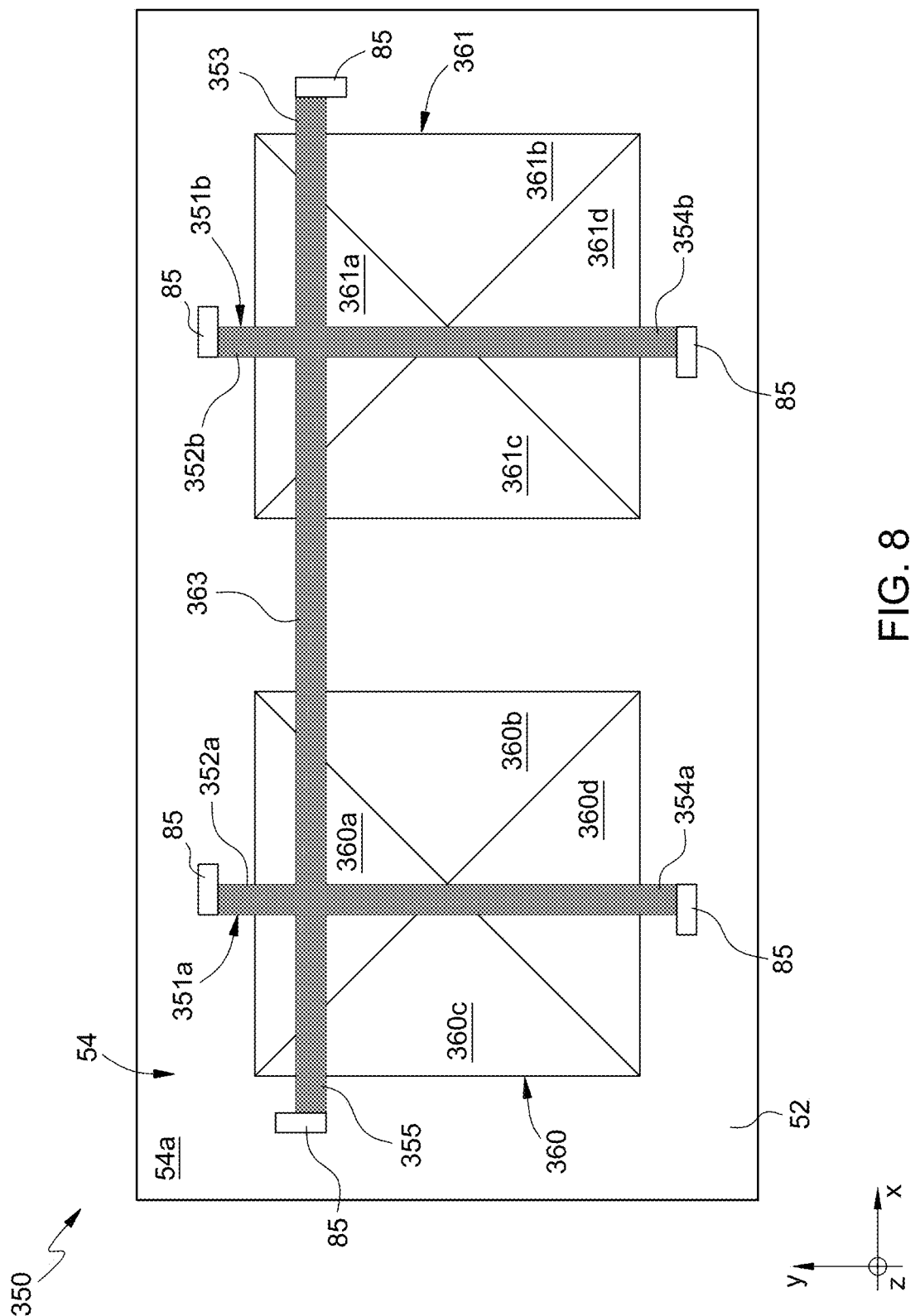

FIG. 8 shows a possible different embodiment (hereinafter referred to as sensor element 350) of the second sensor element 60, 110, 160, 210 and/or of the third sensor element 62, 112, 162, 212 of FIGS. 2, 3, 4, and 5, able to provide high sensitivity.

In particular, the sensor element 350 of FIG. 8 includes a plurality of Hall crosses (for example, two Hall crosses, designated by 351a, 351b), joined together in series by a common arm for each pair of successive Hall crosses. Here, the first cross 351a has a first arm 352a, a second arm 354a, and a third arm 355, coupled to respective contacts 85, and extends partially inside a third recess 360 (for example, having a pyramidal shape with side walls 360a-360d). The second cross 351b has a first arm 352b, a second arm 354b, and a third arm 353, coupled to respective contacts 85, and extends partially inside a fourth recess 361 (for example, having a pyramidal shape with side walls 361a-361d). Moreover, the first cross 351a and the second cross 351b are electrically connected by a common arm 363.

In use, the sensor element 350 is biased to cause the supply current $I_a$ to flow both in the first cross 351a and in the second cross 351b along the respective first and second arms 352a, 352b, 354a, 354b, and a total Hall potential $V_{H,tot}$ is measured between the contacts 85 of the third arms 355, 353 of the first and second crosses 351a, 351b. In practice, the total Hall potential $V_{H,tot}$ is the sum of the Hall potentials $V_H$ of the first and second crosses 351a, 351b and, in this way, the sensor element 350 of FIG. 8 has the same sensitivity as the second sensor element 60, 110, 160, 210 and/or as the third sensor element 62, 112, 162, 212 of FIGS. 2, 3, 4, and 5, however, with a reduction in size of the recesses.

In fact, a Hall cross has a greater sensitivity the larger its dimensions (for example, the longer its arms and the larger the dimensions of the recess or protrusion). The solution of FIG. 8 therefore allows recesses/protrusions of small dimensions to be formed, while increasing the total size due to the presence of a number of Hall crosses in series.

For instance, in this way, it is possible to obtain the same sensitivity for the second sensor element 60 of the embodiments of FIGS. 3 and 8 with a width, along axis X and/or axis Y of the major sides of the third and fourth recesses 360, 361 of FIG. 8, that can be a fraction of the widths of the sides of the first and second recesses 105, 106 of FIG. 3. Furthermore, according to another embodiment, by providing a plurality of recesses or protrusions is also possible to increase the sensitivity.

According to a different embodiment, the third and fourth recesses 360, 361 have both a frustopyramidal shape. According to another embodiment, instead of the third and fourth recesses 360, 361, a third protrusion and a fourth protrusion (having a pyramidal or frustopyramidal shape) may be provided.

Figure 9:
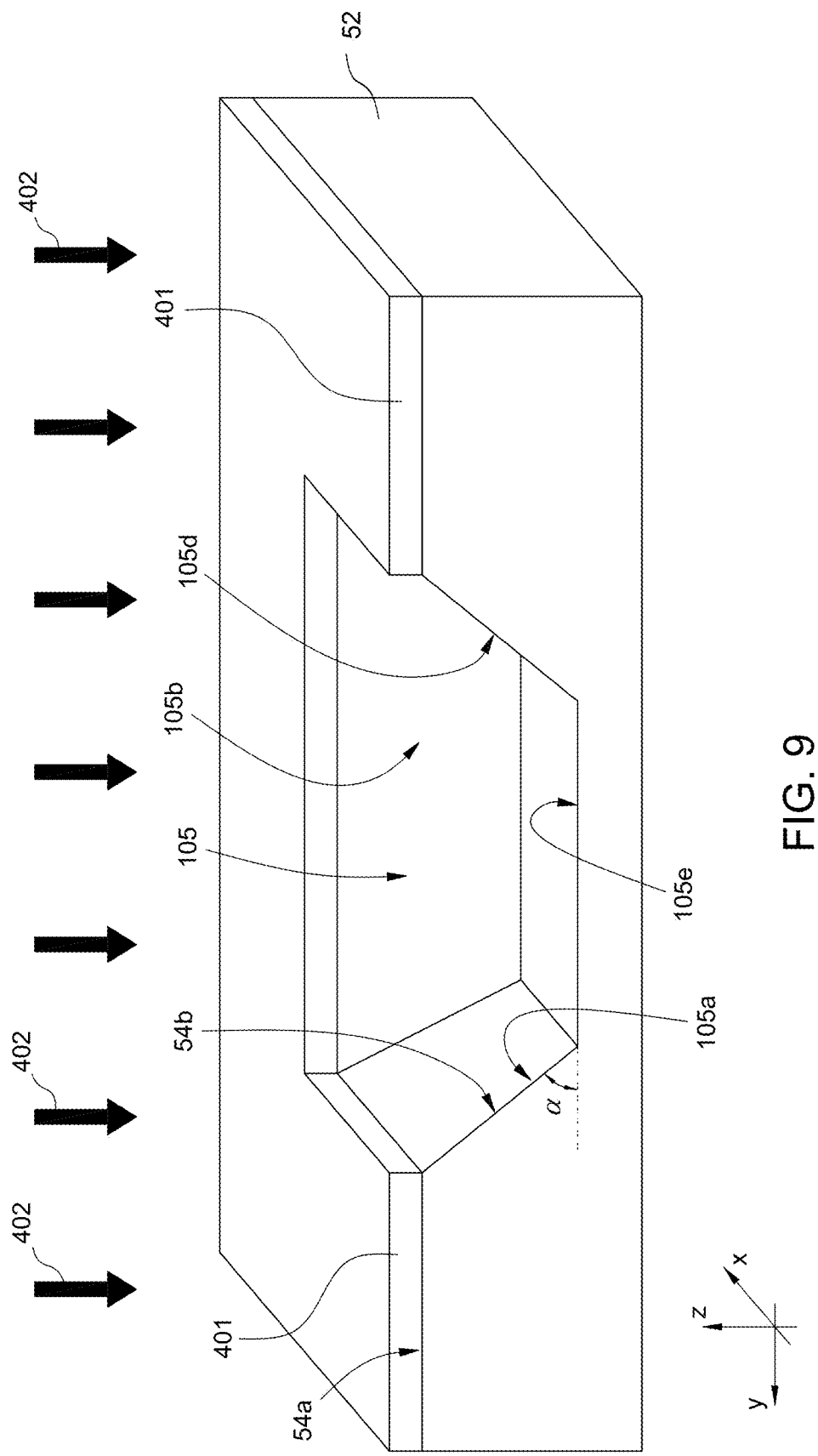
FIG. 9 is a perspective view sectioned along section line IX-IX of FIG. 3, of a part of the triaxial magnetic sensor of FIG. 3, in a manufacturing step.

One of the possible processes for manufacturing the triaxial sensor 100 of FIG. 3 is described below, with reference to FIGS. 9-12. In particular, the manufacturing process is shown in a cross-section taken along section line IX-IX of FIG. 3 and regards formation of the first recess 105 and of the first and fourths arms 31, 34; the same process also leads to simultaneous formation of the second recess 106 of FIG. 3. FIGS. 9-12 also show the structure of the first recess 105 considered in a cross-section along the second and third arms 32, 33. In addition, the described process may be applied, with minor modifications, also to implementation of the embodiments of FIGS. 4-8, as discussed hereinafter. Moreover, the manufacturing steps described hereinafter generally follow and/or precede other steps for forming the other components of the triaxial sensor 50, and therefore not described. To improve understanding thereof, FIG. 9 shows a perspective view in cross-section.

With reference to FIG. 9, the substrate 52, here, for example, of silicon with a crystallographic orientation (100), has already undergone various lithographic steps for depositing a first mask 401, for example, of photoresist, and is subject to anisotropic etching (for example, using KOH), as represented by arrows 402. In this way, a part of the substrate 52, left exposed by the first mask 401, is selectively removed to form the first recess 105. Thereby, the base wall 105e and the first and fourth inclined walls 105a, 105d are also formed, which have crystallographic orientation (111) and are inclined with respect to plane XY by an angle equal to the first inclination angle α. In this step, also the second and third inclined walls 105b, 105c (the latter not being visible in FIG. 9) are formed, and also the planar portion 54a and the non-planar portions 54b, 54c of the surface 54 are defined. The first mask 401 is then removed using an appropriate solvent.

Figure 10:
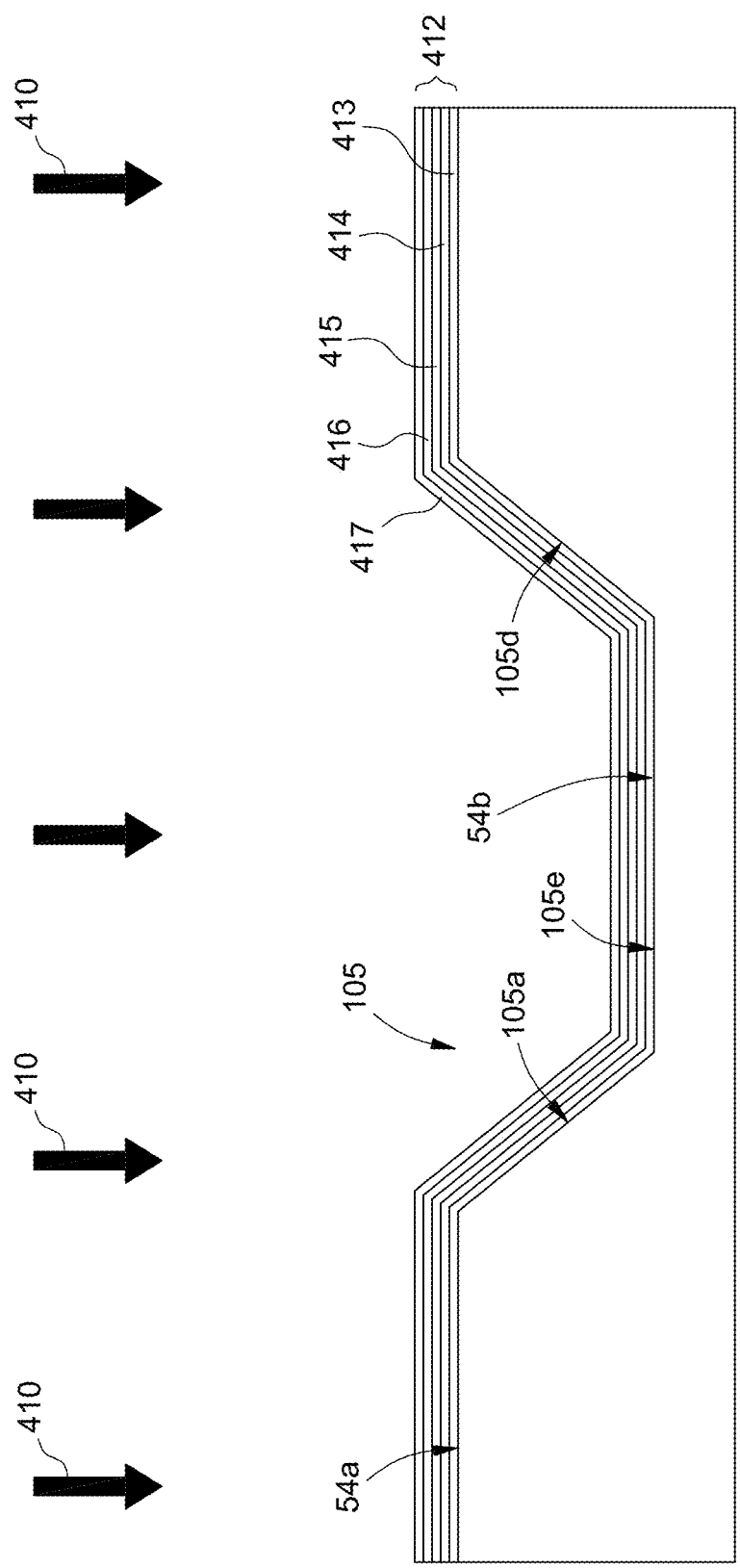
FIGS. 10-12 are cross-sections of the triaxial magnetic sensor of FIG. 9, in subsequent manufacturing steps.

In FIG. 10, a stack 412 of semiconductor materials intended to form the 2DEG region is deposited on the substrate 52, for example, using CVD (Chemical Vapor Deposition), MBE (Molecular-Beam Epitaxy), or RF PAMBE (Radio-Frequency Plasma-Assisted Molecular-Beam Epitaxy). The stack 412 includes, for example, the following layers in succession: an AlN layer 413 (having a thickness, for example, of approximately 50 nm), intended to reduce deformation of the subsequent layers; a first GaN layer 414 (having a thickness, for example, of 300 nm-1.5 µm), intended to form a buffer layer, to improve adhesion of the subsequent layers and reduce effects of difference of lattice pitch; a first AlGaN layer 415 (for example, $Al_{0.2}Ga_{0.8}N$, having a thickness, for example, of approximately 300 nm); a second GaN layer 416 (having a thickness, for example, of approximately 10 nm), intended to form a first heterostructure with the first AlGaN layer 415; and a second AlGaN layer 417 (e.g., $Al_{0.3}Ga_{0.7}N$, having a thickness, for example, of approximately 25 nm), intended to form a second heterostructure with the second GaN layer 416. Consequently, at the second GaN layer 416, the stack 412 forms the 2DEG region with an electron mobility, for example, of approximately 900 cm²/(V·s), and with concentrations of charge carriers up to, for example, $10^{13}$ cm$^{-2}$.

Figure 11:
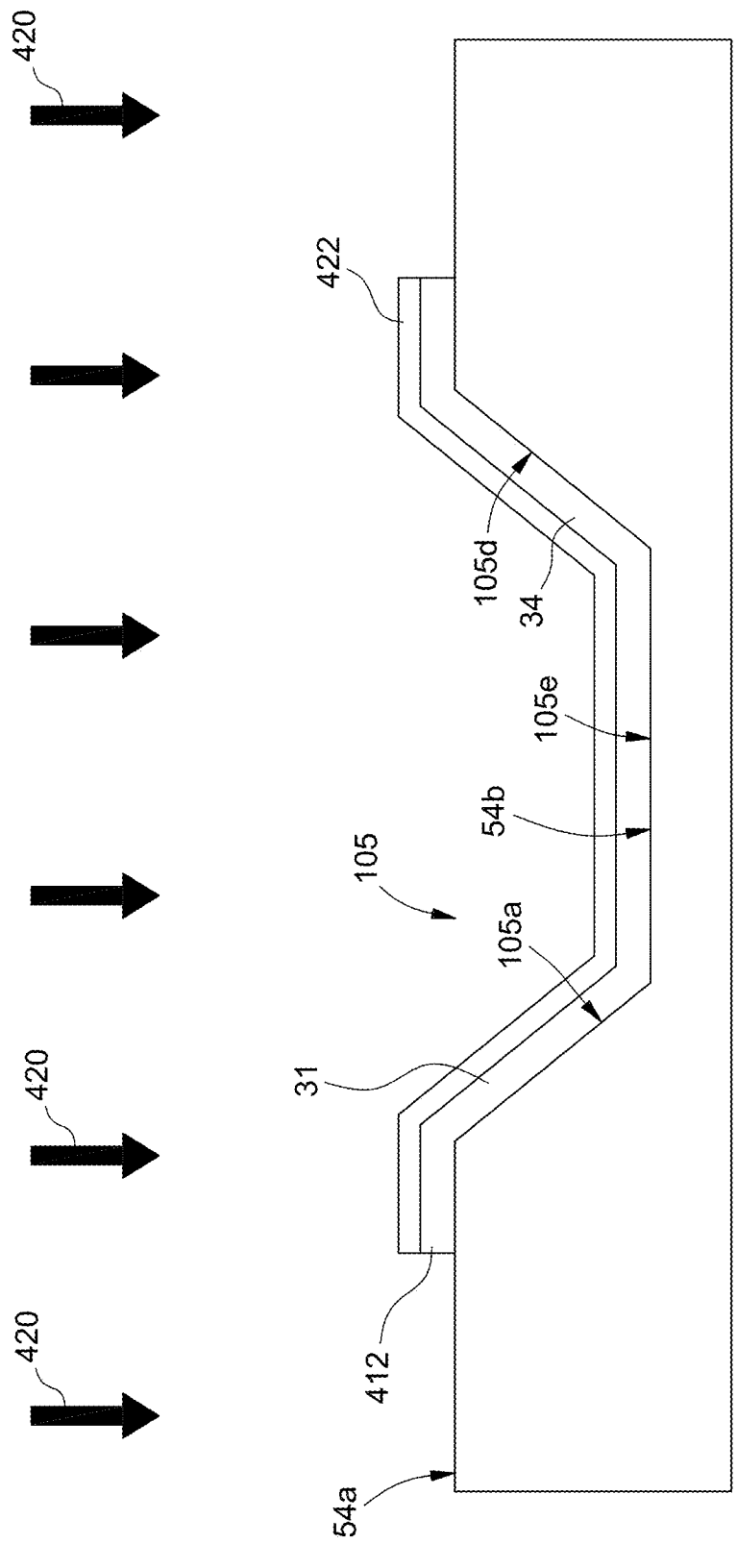

In FIG. 11, the stack 412 is defined. To this end, a second mask 422 is formed and covers the zone of the stack 412 intended to form the arms of the second sensor element 110 (in FIG. 11, the arms 31, 34), whereas the remaining part of the stack 412 remains exposed and is removed by an etching represented by arrows 420. Once the etching 420 is completed, the second mask 422 is removed.

Using lithographic processes, not explained in detail, at the ends of the arms 31-34 of the second sensor element 110, the contacts 85 (three visible in FIG. 12), of metal such as tungsten, aluminium, or copper, are then formed, for example, by metal deposition or sputtering techniques.

The usual final manufacturing steps follow, to form the three-dimensional sensor 50.

Figure 13:
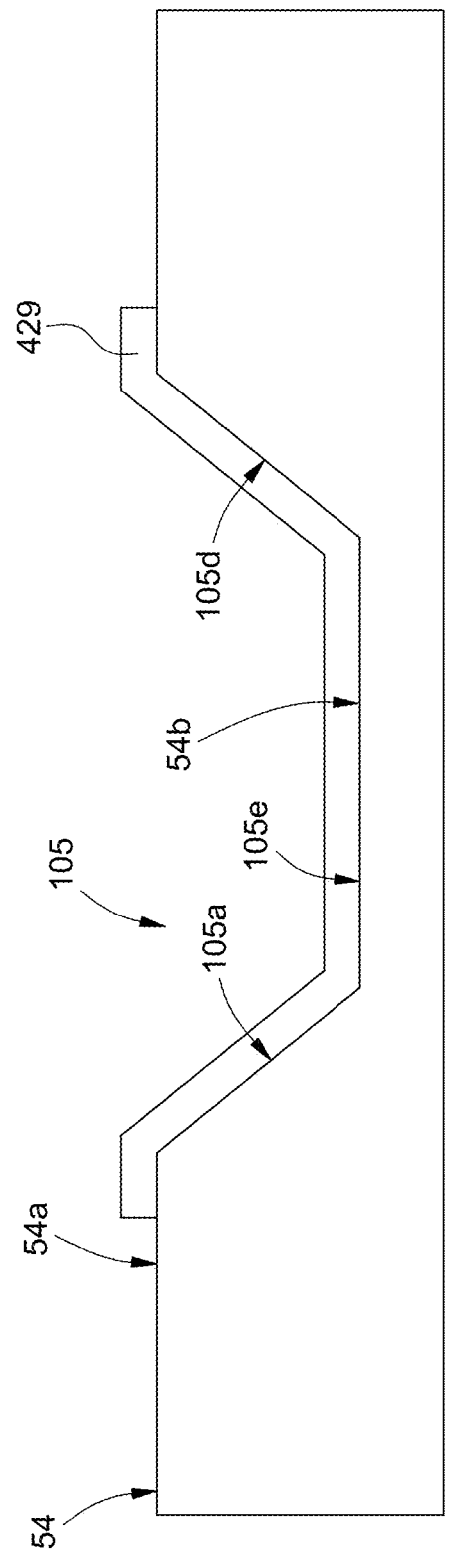
FIGS. 13-15 are cross-sections of a die of an embodiment of a different process in successive manufacturing steps of the triaxial magnetic sensor of FIG. 3.

According to a different manufacturing process (illustrated in FIGS. 13-15), the stack 412 is fabricated using sacrificial layers.

In particular, after forming the structure of FIG. 9, and therefore the first recess 105, an oxide layer 430 (having a thickness greater than the stack 412, for example, approximately 5 µm) is grown on the planar portion 54a of the surface 54. To this end (FIG. 13), a mask 429, for example, of photoresist, is formed on the region where the arms 31-34 of the second sensor element 110 are to be formed. Then (FIG. 14), the oxide layer 430 is grown, for example, thermally, on the planar portion 54a of the surface 54, where it is exposed by the mask 429, and the mask 429 is removed to obtain the structure of FIG. 14.

Figure 12:
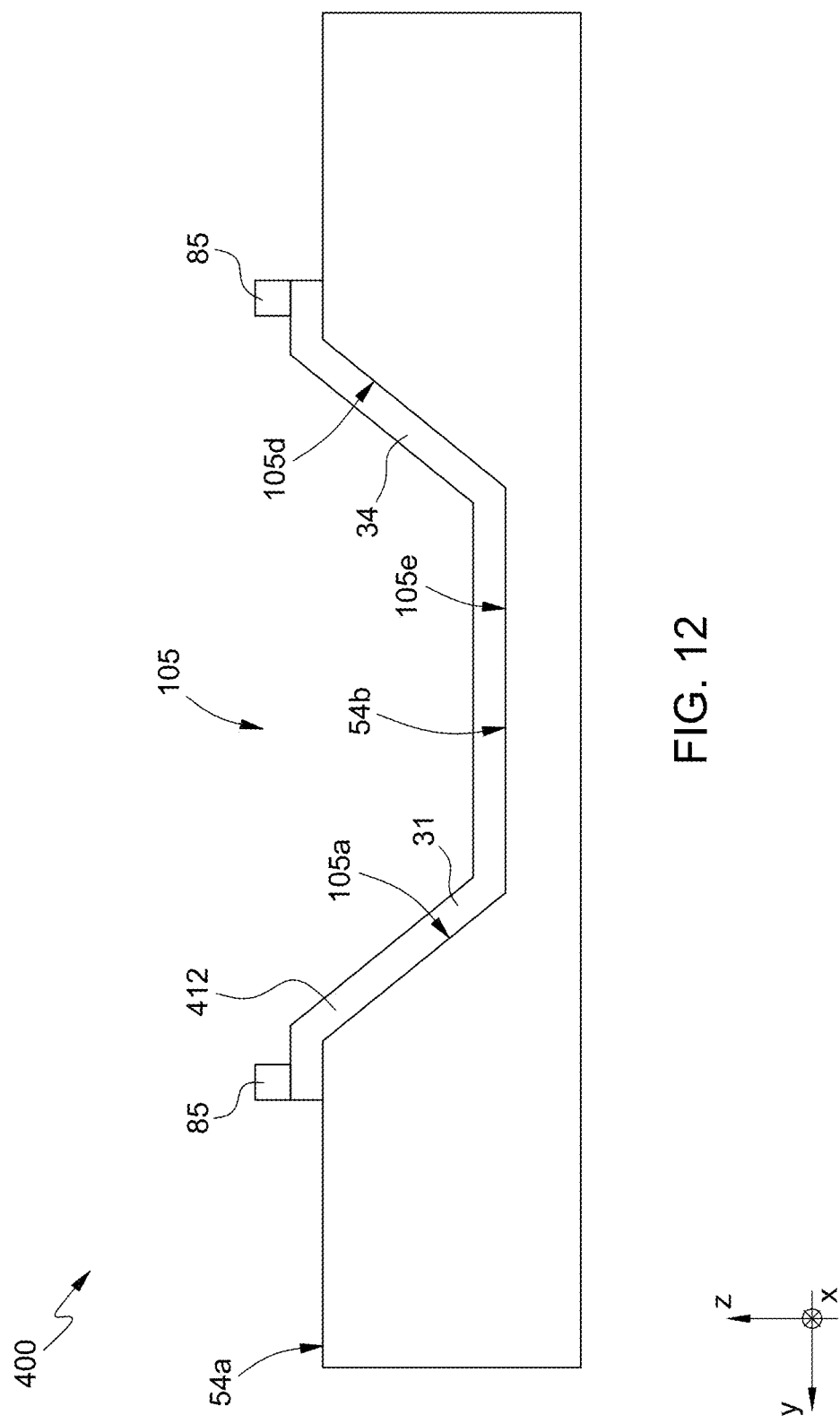
Figure 14:
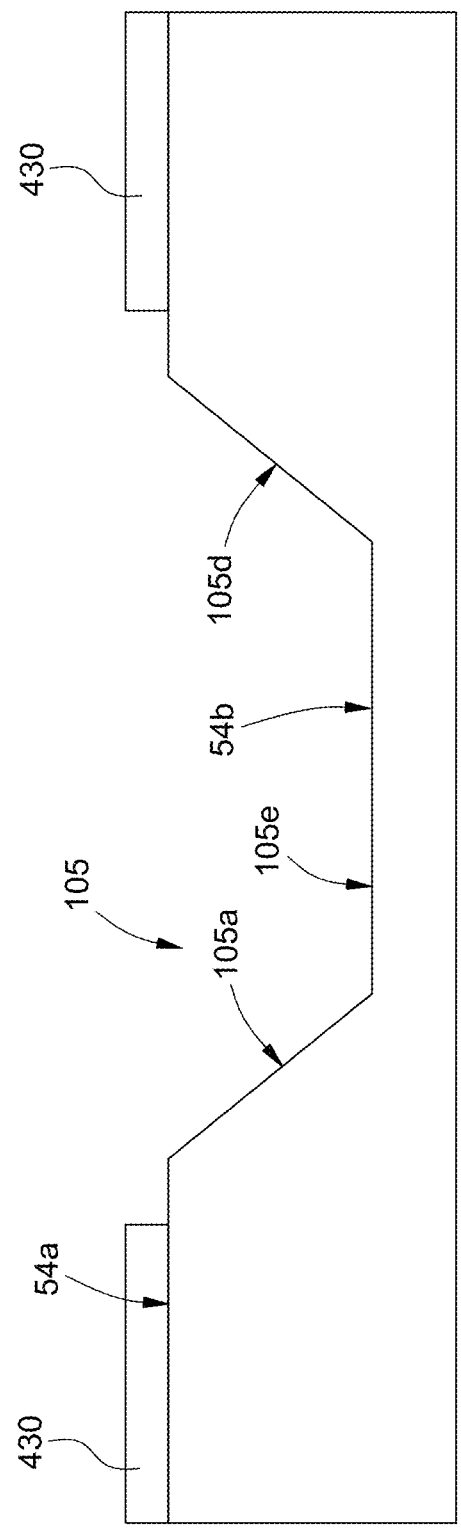
Figure 15:
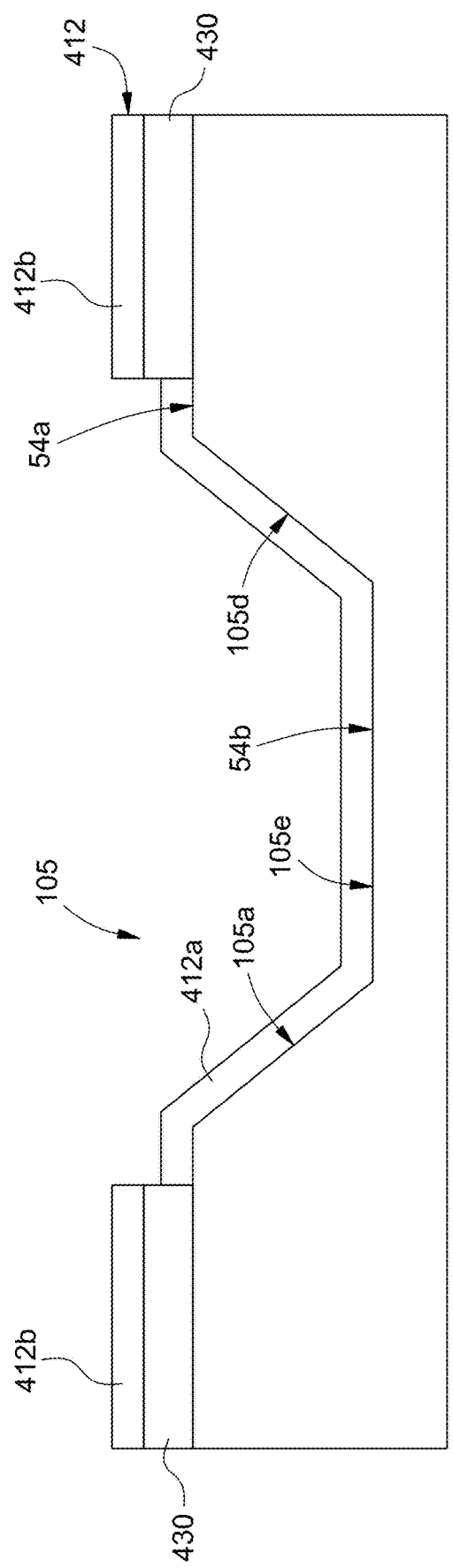

In FIG. 15, the stack 412 is deposited on the structure of FIG. 14. In particular, the stack 412 extends directly on the substrate 52 at the first recess 105 and, in part, on the planar portion 54a of the surface 54 (strip 412a that, here, forms the arms 31, 34) and, elsewhere, extends over the oxide layer 430 (sacrificial portion 412b). Next, the sacrificial portion 412b is removed using various techniques, such as chemical-mechanical polishing, or using an appropriate etching, suitable to completely remove the oxide layer 430, together with a possible masking process. After forming the contacts 85, the same structure of FIG. 12 is obtained.

The process described above may be easily adapted for manufacturing the triaxial sensor 150 of FIG. 4 by reversing the etched areas of the substrate 52 to remove the latter above the planar portion 54a of the surface 54, and for manufacturing the triaxial sensor 200 of FIG. 5, prolonging etching of the substrate 52 to obtain the pyramidal shape.

The first sensor element 58, 208 may be obtained in a way similar to what is illustrated in FIG. 11 by depositing and defining the stack 412 on the planar portion 54a of the surface 54, since any possible differences in lattice pitch at the interface between the planar portion 54a of the surface 54, with crystallographic orientation (100), and the layers 415-417 of the stack 412 are compensated by the layers 413-414 of the stack 412.

Alternatively, in the first sensor element 58, 208, instead of the stack 412, it is possible to use a deposited or grown layer (for example, an epitaxial layer) of semiconductor material, for example, silicon, or some other material having a difference in lattice pitch smaller than the planar portion 54a of the surface 54 with crystallographic orientation (100). Alternatively, the arms 20-23 of the first sensor element 58 may be formed via appropriate doping (obtained, for example, via implantation) in the substrate 52, defined by various techniques to obtain microelectronic structures functionally equivalent to the discussed protrusions and suitable for operating as arms 20-23 of the first sensor element 58. Even though in this case the sensitivity in the measure of the first magnetic field $B_z$ could be lower, the control unit 70 may introduce a corrective compensation factor, for example, by amplification. Alternatively, the first sensor element 58 may be of metal conductive material, for example, aluminium, copper, gold, tungsten, etc. In this case conductive material may be isolated from substrate 52 using a dielectric layer (for example an oxide layer). Also in this case, the control unit 70 may introduce a corrective compensation factor, for example, by amplification.

The triaxial magnetic sensor described above has numerous advantages.

In particular, it allows an external magnetic field to be determined in a complete way using a structure that may be easily integrated and is of small dimensions. Use of the 2DEG region, which has high mobility and charge carrier concentration moreover achieves high measure sensitivity, making use and marketing thereof advantageous. In particular, the above triaxial sensor enables measuring magnetic fields, for example, of the order of hundreds of nanotesla, enabling generation of Hall potentials in the region of 10-30 mV in response to magnetic fields of approximately 200 nT.

The present triaxial sensor has a higher reliability in use since it does not include suspended structures or regions glued together and therefore is not significantly affected by vibrations or impact, and may therefore be integrated in just one substrate, thus obtaining a monolithic device.

The manufacturing process is moreover well consolidated and readily reproducible.

Finally, it is clear that modifications and variations may be made to the triaxial magnetic sensor described and illustrated herein, without thereby departing from the scope of the present disclosure.

For instance, the sensor elements may have a shape different from the cross shape illustrated in the figures, and may have any of a plurality of different embodiments of Hall-effect magnetic sensors (see, for example, Handbook of Sensors and Actuators, Volume 2—Solid State Magnetic Sensors, Chavdar S. Roumenin, et al., Elsevier, 1984), which include, for example, circular shapes, polygonal shapes (such as octagonal or square shapes) and shapes with a more complex geometry. In this case, the term "arm" refers to the portions of the magnetosensitive material arranged between pairs of contacts 85.

Moreover, as already mentioned, the substrate 52 may be of a semiconductor material other than silicon, such as GaN or GaAs, which adhere better to the stack 412.

In this case, it is possible to form recesses or protrusions including a greater or lower number of inclined walls than what previously illustrated (for example, pyramids with a triangular or hexagonal base, with three or six side walls). For instance, in case of a hexagonal base, it is possible to integrate more Hall crosses, electrically separated from each other, on different inclined walls of a same recess. It is thus possible to simultaneously measure different components of the external magnetic field B via Hall crosses manufactured in a same recess or protrusion, without any need to periodically alternate the supply current $I_a$ between arms of a same Hall cross 1, as illustrated in FIGS. 6 and 7.

In general, in any case, the shape of the recesses or protrusions may be different; for example, they may have a pyramidal or frustopyramidal shape with a quadrangular or, in general, polygonal, base, and the manufacturing techniques may differ from what described; for example, it is possible to carry out laser removal or growth using 3D printing.

Furthermore, although in the drawings and in the foregoing description the arms of the sensor elements have been represented as being parallel to each other along axes X and Y, this arrangement is not indispensable, and other angular orientations are possible, provided that the central areas 80 and 82 are arranged on inclined walls forming the non-zero mutual inclination angle γ with respect to each other and enabling the second and third sensor elements to measure the second and third magnetic fields $B_α$, $B_β$, respectively, that are different from each other and not coinciding.

The control unit 70 of FIG. 2 may moreover be integrated in a die separate from the triaxial sensor 50, if so desired.

In addition, even though the recesses 105, 106 (as likewise the protrusions 154, 156) are here represented aligned and with surfaces parallel to each other as described previously, embodiments (not illustrated) are possible where they may have a further inclination angle with respect to each other.

At least one between the second sensor element 60, 110, 160, 210 and the third sensor element 62, 112, 162, 212 may moreover be manufactured by a respective deposited or grown layer (for example, an epitaxial layer) of semiconductor material other than silicon, or of metal conductive material (for example, aluminum, copper, gold, tungsten, etc.).

Figure 16:
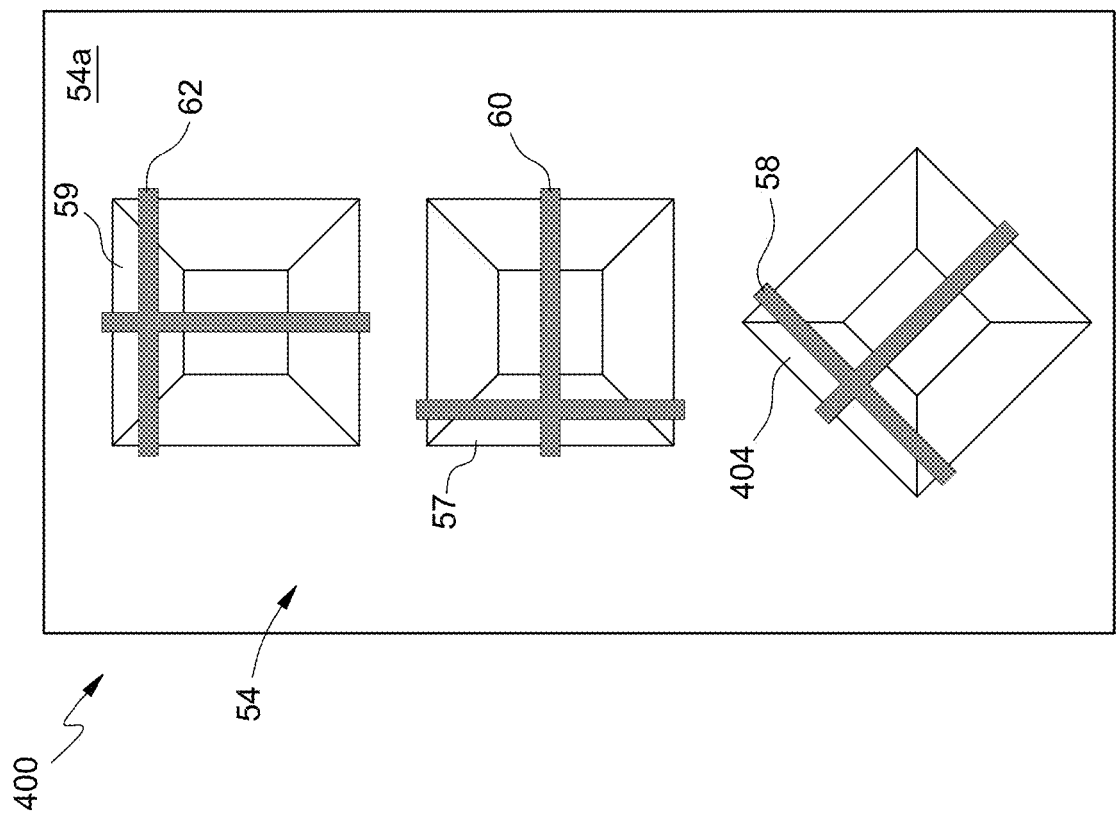
FIG. 16 is a top view of a further embodiment of the present triaxial magnetic sensor.

Furthermore, it is possible to obtain a plurality of recesses and/or protrusions on a same substrate or on different substrates, which have further mutual inclination angles to improve the angular resolution in measuring the magnetic field. A same semiconductor substrate may thus simultaneously have at least one recess and at least one protrusion. In this case, three not mutually coplanar sensor elements may be arranged on different inclined walls arranged on the recesses and/or protrusions. In this way, the first sensor element 58, 208 lies on a respective inclined wall that does not extend in plane XY. In particular, according to this embodiment of the present disclosure (triaxial sensor 400 of FIG. 16), the first sensor element 58, 208 does not extend parallel to plane XY (i.e., it does not lie on at least one between the planar portion 54a and the surfaces 105e, 106e, 154e, 156e, 270e), but extends at least partially over a sensing portion (illustrated in FIG. 16 and designated by reference number 404) of the surface 54, inclined with respect to the first and second sensing walls (105a, 106b; 154a, 156a; 204a, 206a; 270a, 270b), which house, at least in part, the second and third sensor elements (60, 62; 110, 112; 160; 210; 271), respectively. The sensing portion 404 and the first and second sensing walls (105a, 106b; 154a, 156a; 204a, 206a; 270a, 270b) are therefore not mutually coplanar, and form solid angles with respect to each other, namely: a first solid angle $θ_1$ (a projection whereof in a plane YZ formed by the axes Y and Z corresponds to the first inclination angle α in the embodiment illustrated in FIG. 9, where the sensing portion 404 coincides with the planar portion 54a extending in a plane parallel to plane XY) formed between the sensing portion 404 and the first sensing wall 105a, 154a, 204a, 270a; a second solid angle $θ_2$ (a projection whereof in a plane XZ formed by axes X and Z corresponds to the second inclination angle β in the embodiment illustrated in FIG. 3A, where the sensing portion 404 coincides with the planar portion 54a extending in a plane parallel to plane XY) formed between the sensing portion 404 and the second sensing wall 106b, 156a, 206a, 270b; and a third solid angle $θ_3$ (a projection whereof in plane XY corresponds to the mutual inclination angle γ in the embodiment illustrated in FIG. 2, where the sensing portion 404 coincides with the planar portion 54a extending in a plane parallel to plane XY) formed between the first sensing wall 105a, 154a, 204a, 270a and the second sensing wall 106b, 156a, 206a, 270b. In detail, the solid angles $θ_1$, $θ_2$, and $θ_3$ have an amplitude related to the manufacturing process and to the particular semiconductor material used. It is thus possible to determine the external magnetic field B (i.e., the first projection $B_x$, the second projection $B_y$, and the third projection $B_z$) via the data-processing operations previously described, for example, using a further system of three equations in three unknowns.

In particular, in the embodiments described with reference to FIGS. 2-7, the planar portion 54a of the surface 54 corresponds to, and coincides with, the sensing portion 404; moreover, the first inclination angle α corresponds to the projection of the first solid angle $θ_1$ in the plane YZ, the second inclination angle β corresponds to the projection of the second solid angle $θ_2$ in plane XZ, and the mutual inclination angle γ corresponds to the projection of the third solid angle $θ_3$ in plane XY. In particular, with reference by way of example to the embodiment of FIG. 3, the plane YZ is the lying plane (orthogonal to the plane XY) of the arms 31, 34 of the second sensor element 110 (the arms 31, 34 being assumed as having a negligible extension along axes X and Z, and therefore being assumed as extending along axis Y). In addition, the plane XZ is the lying plane (orthogonal to the plane XY and to the plane YZ) of the arms 32, 33 of the second sensor element 110 (the arms 32, 33 being assumed as having a negligible extension along axes Y and Z, and therefore being assumed as extending along axis X).

According to a further embodiment of the present disclosure, the system includes more than three Hall-effect sensors not coplanar to each other. Calculation of the value of the external magnetic field is thus obtained from the solution of an overdetermined equation system according to standard methods (for example, via the least-squares method) or choosing three available measures obtained from the sensor elements of the triaxial sensor (for example, the three highest measures in absolute value, and therefore probably the ones with lowest signal-to-noise ratio) and using them to solve a three equation system in three unknowns.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A triaxial magnetic sensor, comprising:
    a substrate having a surface, a first angled sidewall, and a second angled sidewall, the surface and the first angled sidewall forming a first angle, an interface between the surface and the first angled sidewall extending in a first direction, the surface and the second angled sidewall forming a second angle, an interface between the surface and the second angled sidewall extending in a second direction transverse to the first direction;
    a first Hall-effect magnetic sensor on the surface of the substrate;
    a second Hall-effect magnetic sensor on the first angled sidewall; and
    a third Hall-effect magnetic sensor on the second angled sidewall.

2. The triaxial magnetic sensor according to claim 1, wherein
    the surface is planar and extends in a first plane,
    the first angle is in a second plane transverse to the first plane,
    the second angle is in a third plane transverse to the first plane and to the second plane.

3. The triaxial magnetic sensor according to claim 2, wherein the substrate is silicon, and each of the first and the second angles is between 50° and 60°.

4. The triaxial magnetic sensor according to claim 1, wherein each of the second and the third Hall-effect magnetic sensors includes a heterostructure configured to generate a two-dimensional electron gas.

5. The triaxial magnetic sensor according to claim 4, wherein the heterostructure includes at least one gallium nitride layer and at least one gallium and aluminium nitride layer physically coupled to the gallium nitride layer.

6. The triaxial magnetic sensor according to claim 1, wherein each of the first and the second angled sidewalls is a wall of a non-planar structure that includes a recess, which extends into the substrate, or a protrusion, which projects out of the substrate.

7. The triaxial magnetic sensor according to claim 6, wherein the non-planar structure has a shape of a frustum of a pyramid or of a pyramid with polygonal base.

8. The triaxial magnetic sensor according to claim 6, wherein
    the first and the second angled sidewalls are walls of a first and, respectively, a second non-planar structure,
    each of the second and the third Hall-effect magnetic sensors includes first, second, third, and fourth non-planar sensing arms including conductive material,
    the first, second, third, and fourth non-planar sensing arms of the second Hall-effect magnetic sensor include respective first ends in direct electrical contact with each other at a first sensing area on the first angled sidewall, and respective second ends electrically coupled to respective conductive contacts,
    the first, second, third, and fourth non-planar sensing arms of the third Hall-effect magnetic sensor include respective first ends in direct electrical contact with each other in a second sensing area on the second angled sidewall, and respective second ends electrically coupled to respective conductive contacts.

9. The triaxial magnetic sensor according to claim 8, wherein
    the conductive contacts electrically coupled to the second and to the third non-planar sensing arms are used as biasing terminals in a first operating step and sensing terminals in a second operating step, and
    the conductive contacts electrically coupled to the first and to the fourth non-planar sensing arms are used as sensing terminals in the first operating step and biasing terminals in the second operating step.

10. The triaxial magnetic sensor according to claim 9, wherein
    the first Hall-effect magnetic sensor includes first, second, third, and fourth planar sensing arms including conductive material,
    the first, second, third, and fourth planar sensing arms of the first Hall-effect magnetic sensor are coupled together at a third sensing area on the surface of the substrate,
    the second planar sensing arm and the third non-planar sensing arm are electrically coupled at a common contact.

11. The triaxial magnetic sensor according to claim 1, further comprising:
    a control unit electrically coupled to the first, second, and third Hall-effect magnetic sensors, the control unit configured to:
        receive, from the first, second, and third Hall-effect magnetic sensors, Hall potentials;
        associate magnetic-field values to the Hall potentials; and
        determine, from the magnetic-field values, an external magnetic field.

12. The triaxial magnetic sensor according to claim 1, wherein
    the first Hall-effect magnetic sensor extends at least partially over a planar portion of the surface of the substrate and is a planar type sensor,
    the second Hall-effect magnetic sensor is a non-planar type sensor, and
    the third Hall-effect magnetic sensor is a non-planar type sensor.

13. The triaxial magnetic sensor according to claim 1, wherein
    the first Hall-effect magnetic sensor is configured to measure a first magnetic field along a third direction transverse to the first direction and the second direction,
    the second Hall-effect magnetic sensor is configured to measure a second magnetic field having a first component along the second direction and a second component along the third direction, and
    the third Hall-effect magnetic sensor is configured to measure a third magnetic field having a third component along the first direction and a fourth component along the third direction.

14. The triaxial magnetic sensor according to claim 1, wherein
    the second Hall-effect magnetic sensor has a first conductive arm and a second conductive arm, the first conductive arm positioned in part on the surface of the substrate and in part on the first angled sidewall, the second conductive arm positioned in part on the surface of the substrate and in part on the first angled sidewall, the first and second conductive arms intersecting in a first sensing area on the first angled sidewall; and
    the third Hall-effect magnetic sensor has a third conductive arm and a fourth conductive arm, the third conductive arm positioned in part on the surface of the substrate and in part on the second angled sidewall, the fourth conductive arm positioned in part on the surface of the substrate and in part on the second angled sidewall, the first and second conductive arms intersecting in a second sensing area on the second angled sidewall.

15. A process for manufacturing a triaxial magnetic sensor, comprising:
forming a first angled sidewall and a second angled sidewall on or in a substrate, a surface of the substrate and the first angled sidewall forming a first angle, an interface between the surface of the substrate and the first angled sidewall extending in a first direction, the surface of the substrate and the second angled sidewall forming a second angle, an interface between the surface of the substrate and the second angled sidewall extending in a second direction transverse to the first direction;
forming a first Hall-effect magnetic sensor on the surface of the substrate;
forming a second Hall-effect magnetic sensor on the first angled sidewall; and
forming a third Hall-effect magnetic sensor on the second angled sidewall.

16. The process according to claim 15, wherein forming the first and the second angled sidewalls includes:
etching the surface of the substrate; and
forming non-planar structures, each of the non-planar structures being a recess, which extends into the substrate, or a protrusion, which projects out of the substrate.

17. The process according to claim 16, wherein
the substrate is silicon,
the etching is a KOH etching,
the surface of the substrate is planar and extends in a first plane,
the first angle is in a second plane transverse to the first plane, and
the second angle is in a third plane transverse to the first plane and to the second plane.

18. The process according to claim 15, wherein forming the second Hall-effect magnetic sensor and forming the third Hall-effect magnetic sensor includes depositing, on the first and on the second sensing walls, a stack of semiconductor materials defining an heterostructure configured to generate a two-dimensional electron gas.

19. The process according to claim 18, wherein depositing the stack includes:
covering the surface of the substrate with a plurality of layers; and
patterning the plurality of layers.

20. The process according to claim 18, wherein depositing the stack includes:
forming, on the first and on the second sensing walls, a masking layer having at least one opening;
depositing a plurality of layers on the masking layer and in the opening; and
removing the plurality of layers above the masking layer.

21. A device, comprising:
a substrate including a surface having a first region and a second region;
a first structure in the first region, the first structure including plurality of sidewalls, the first structure being a recess or a protrusion;
a first Hall-effect magnetic sensor configured to measure a magnetic field along a first axis, the first Hall-effect magnetic sensor being positioned in the first region, the first Hall-effect magnetic sensor including a first conductive arm that extends in a first direction and a second conductive arm that extends in a second direction transverse to the first direction, a portion of the first conductive arm being positioned on a first sidewall of the plurality of sidewalls, a portion of the second conductive arm being positioned on a second sidewall of the plurality of sidewalls; and
a second Hall-effect magnetic sensor configured to measure a magnetic field along a second axis transverse to the first axis, the second Hall-effect magnetic sensor being on the surface of the substrate and in the second region.

22. The device according to claim 21 wherein
the second Hall-effect magnetic sensor includes a third conductive arm that extends in the first direction and a fourth conductive arm that extends in the second direction, and
the first conductive arm and the third conductive arm are physically and electrically coupled to each other.

23. A triaxial magnetic sensor, comprising:
a substrate having a surface, a first angled sidewall, and a second angled sidewall, the surface and the first angled sidewall forming a first angle, the surface and the second angled sidewall forming a second angle;
a first Hall-effect magnetic sensor on the surface of the substrate;
a second Hall-effect magnetic sensor on the first angled sidewall; and
a third hall-effect magnetic sensor on the second angled sidewall, each of the second and the third Hall-effect magnetic sensors including a heterostructure configured to generate a two-dimensional electron gas.

24. The triaxial magnetic sensor according to claim 23 wherein the heterostructure includes at least one gallium nitride layer and at least one gallium and aluminium nitride layer physically coupled to the gallium nitride layer.

25. A triaxial magnetic sensor, comprising:
a substrate having a surface, a first angled sidewall, and a second angled sidewall, the surface and the first angled sidewall forming a first angle, the surface and the second angled sidewall forming a second angle, the first angled sidewall and the second angled sidewall being walls of a first non-planar structure and a second non-planar structure, respectively;
a first Hall-effect magnetic sensor on the surface of the substrate;
a second Hall-effect magnetic sensor on the surface of the first angled sidewall; and
a third Hall-effect magnetic sensor on the surface of the second angled sidewall,
each of the second and the third Hall-effect magnetic sensors including first, second, third, and fourth non-planar sensing arms including conductive material,
the first, second, third, and fourth non-planar sensing arms of the second Hall-effect magnetic sensor including respective first ends in direct electrical contact with each other at a first sensing area on the first angled sidewall, and respective second ends electrically coupled to respective conductive contacts,
the first, second, third, and fourth non-planar sensing arms of the third Hall-effect magnetic sensor including respective first ends in direct electrical contact with each other in a second sensing area on the second angled sidewall, and respective second ends electrically coupled to respective conductive contacts.

26. The triaxial magnetic sensor according to claim 25 wherein
- the conductive contacts electrically coupled to the second and to the third non-planar sensing arms are used as biasing terminals in a first operating step and sensing terminals in a second operating step, and
- the conductive contacts electrically coupled to the first and to the fourth non-planar sensing arms are used as sensing terminals in the first operating step and biasing terminals in the second operating step.

* * * * *